(12) United States Patent
Konishi et al.

(10) Patent No.: US 8,138,580 B2
(45) Date of Patent: Mar. 20, 2012

(54) ADHESIVE COMPOSITION FOR ELECTRONIC COMPONENTS, AND ADHESIVE SHEET FOR ELECTRONIC COMPONENTS USING THE SAME

(75) Inventors: Yukitsuna Konishi, Otsu (JP);
Hirohumi Tsuchiya, Otsu (JP);
Shinsuke Kimura, Otsu (JP); Yasushi Sawamura, Otsu (JP)

(73) Assignee: Toray Industries, Inc., Tokyo (JP)

( * ) Notice: Subject to any disclaimer, the term of this patent is extended or adjusted under 35 U.S.C. 154(b) by 216 days.

(21) Appl. No.: 12/678,890

(22) PCT Filed: Sep. 12, 2008

(86) PCT No.: PCT/JP2008/066511
§ 371 (c)(1),
(2), (4) Date: Mar. 18, 2010

(87) PCT Pub. No.: WO2009/038020
PCT Pub. Date: Mar. 26, 2009

(65) Prior Publication Data
US 2010/0193961 A1    Aug. 5, 2010

(30) Foreign Application Priority Data

Sep. 19, 2007 (JP) ................. 2007-241983
Sep. 19, 2007 (JP) ................. 2007-241984
Sep. 20, 2007 (JP) ................. 2007-243462

(51) Int. Cl.
*H01L 23/58* (2006.01)

(52) U.S. Cl. ........... 257/642; 257/E23.142; 257/634; 257/635; 257/657; 257/688; 438/725; 438/780; 525/403; 525/407

(58) Field of Classification Search ........... 257/E23.142, 257/632–635, 638, 642, 657, 688, 773, 786; 438/22, 82, 725, 780; 428/41.7, 447; 524/91, 524/431, 500; 525/100, 393, 398, 403, 404, 525/407, 478

See application file for complete search history.

(56) References Cited

U.S. PATENT DOCUMENTS

| | | | |
|---|---|---|---|
| 5,530,075 A * | 6/1996 | Morita et al. ................. | 525/431 |
| 5,985,043 A * | 11/1999 | Zhou et al. ................... | 148/24 |
| 6,641,928 B2 * | 11/2003 | Takeichi et al. .............. | 428/626 |
| 6,833,180 B1 * | 12/2004 | Kodemura .................... | 428/220 |
| 7,070,670 B2 * | 7/2006 | Tomiyama et al. ........... | 156/248 |
| 7,615,387 B2 * | 11/2009 | Miyoshi ........................ | 438/22 |
| 8,057,906 B2 * | 11/2011 | Kashiwagi et al. ........... | 428/447 |

FOREIGN PATENT DOCUMENTS

| | | |
|---|---|---|
| JP | 04-293950 A | 10/1992 |
| JP | 6-256732 A | 9/1994 |
| JP | 6-306338 | 11/1994 |
| JP | 2002-60716 A | 2/2002 |
| JP | 2005-132860 A | 5/2005 |
| JP | 2006-213872 A | 8/2006 |
| JP | 2006-283002 A | 10/2006 |
| JP | 2007-277525 A | 10/2007 |

\* cited by examiner

*Primary Examiner* — Chris Chu
(74) *Attorney, Agent, or Firm* — Birch, Stewart, Kolasch & Birch, LLP

(57) ABSTRACT

In order to provide an adhesive composition for electronic components that is excellent in adhesion durability under long-term high temperature conditions, thermal cyclability, and insulation reliability, designed is an adhesive composition for electronic components containing a thermoplastic resin (a), an epoxy resin (b), a hardener (c), and an organopolysiloxane (d), wherein the glass transition temperature (Tg) after curing is −10° C. to 50° C. and the rate of change of Tg after heat-treating the composition at 175° C. for 1000 hours is 15% or less.

15 Claims, 4 Drawing Sheets

ADHESIVE COMPOSITION FOR ELECTRONIC COMPONENTS, AND ADHESIVE SHEET FOR ELECTRONIC COMPONENTS USING THE SAME

TECHNICAL FIELD

The present invention relates to an adhesive composition for electronic components and to an adhesive sheet for electronic components.

BACKGROUND ART

In recent years, downsizing and increase in packaging density of electronic instruments have advanced rapidly. Adhesive compositions to be used for electronic instruments are required to satisfy various properties, such as adhesiveness, heat resistance and insulation property, because they often remain as adhesives in packages eventually.

Recently, much attention has been put on GaN (gallium nitride) and SiC (silicon carbide) with excellent electrical characteristics instead of silicon (Si) wafers that have heretofore been used as semiconductor elements, and the use of GaN and SiC has increased in the field of a power device and the like. In particular, because of excellent electrical characteristics of SiC, the voltage applied to a unit area of Si becomes higher than that for Si, and along with it, the temperature applied to a unit area also becomes higher. Therefore, an adhesive is also required to have high heat resistance being higher than 150° C., sometimes higher than 200° C., and moreover it is also required to have a long-term high temperature resistance enough for maintaining adhesiveness at that temperature for a long period of time.

It has been disclosed that a tape with an adhesive for TAB and a tape with an adhesive for a lead frame that contain a thermoplastic resin like polyamide, a thermosetting resin like an epoxy resin and a silicone resin in an adhesive layer exert high insulation reliability (see, for example, patent documents 1 and 2). Moreover, an adhesive composition containing an elastomer, a thermosetting component, an inorganic filler, a hardener, and a silicone oligomer has been proposed in order to improve workability or reflow solder heat resistance (see, for example, patent document 3). However, these conventional adhesive compositions had a problem that electrical characteristics and adhesion durability are insufficient under the aforementioned high temperature condition over a long period of time.

Patent document 1: JP 6-256732 A
Patent document 2: JP 6-306338 A
Patent document 3: JP 2006-283002 A

DISCLOSURE OF THE INVENTION

Problem to be Solved by the Invention

In light of these problems, an object of the present invention is to provide an adhesive composition for electronic components that is excellent in adhesion durability under high temperature conditions over a long period of time, thermal cyclability and insulation reliability, and an adhesive sheet for electronic components using the same.

Means for Solving the Problem

The present invention is directed to an adhesive composition for electronic components including (a) a thermoplastic resin, (b) an epoxy resin, (c) a hardener, and (d) an organopolysiloxane, wherein the glass transition temperature (Tg) after curing is −10° C. to 50° C. and the rate of change of Tg after heat-treating the composition at 175° C. for 1000 hours is 15% or less, and an adhesive sheet for electronic components using the same.

Effect of the Invention

Since the adhesive composition for electronic components of the present invention maintains excellent adhesiveness even under a high temperature condition over a long period of time and is excellent in thermal cyclability and insulation reliability, the reliability of an electronic component using it can increase.

Figure 1:
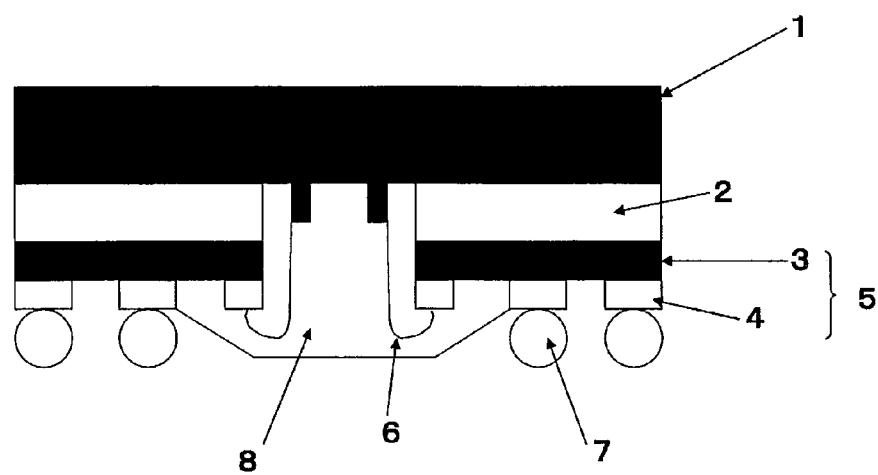
FIG. 1 is a sectional view of one embodiment of a BGA type semiconductor apparatus using an adhesive sheet of the present invention.

EXPLANATION OF REFERENCE SYMBOLS 1, 9, 17 Semiconductor integrated circuit
2, 10, 15a, 15b, 15c, 19 Adhesive layer
3, 12 Insulator layer
4 Conductor pattern
5 Substrate for connecting a semiconductor integrated circuit
6 Bonding wire
7, 11 Solder ball
8 Sealing resin
13a, 13b, 13c First conductive layer
14 Ceramic substrate
16 Second conductive layer
18 Silicon wafer
20 Pattern tape for evaluation
21 Island A
22 Sea C
23 Island B
24 Inorganic filler

BEST MODE FOR CARRYING OUT THE INVENTION

The adhesive composition for electronic components of the present (henceforth, referred to as the adhesive composition) is characterized in that (a) a thermoplastic resin, (b) an epoxy resin, (c) a hardener, and (d) an organopolysiloxane are contained, that the glass transition temperature (Tg) after curing is −10° C. to 50° C., and that the rate of change of Tg after heat-treating the composition at 175° C. for 1000 hours is 15% or less. In order to increase the reliability of an electronic component, such as a semiconductor apparatus under a high temperature condition over a long period of time, it is important to design an adhesive excellent in adhesion durability over a long period of time, thermal cyclability, and insulation reliability. For this reason, it is necessary that the glass transition temperature (Tg) after curing be −10° C. to 50° C. and the rate of change of Tg after heat-treating the composition at 175° C. for 1000 hours be 15% or less. The Tg after curing of an adhesive composition is indicative of a thermal stress relaxation effect under a thermal cycle (thermal shock) environment. Moreover, it is also indicative of change of the state of motion of an electron or an ion caused by the Joule heat generated when a voltage is applied, i.e., change of insulation reliability. In the field of a power device and the like, adhesion durability as high as 10000 hours at 150° C. is required. According to the knowledge of the present inventors, a state after heat treatment equivalent to 10000 hours at 150° C. is reproduced by performing heat treatment at 175° C. for 1000 hours. Therefore, in the present invention, focusing attention on a Tg after curing and a rate of change in Tg after a heat treatment at 175° C. for 1000 hours and bringing them into the aforementioned ranges make it possible to design an adhesive composition excellent in adhesion durability over a long period of time, thermal cyclability, and insulation reliability.

In the present invention, the term "after curing" refers to one having a reaction ratio of 40% or more. The reaction ratio denotes a percentage (%) produced by determining the amount of residual amount of generated heat of an adhesive composition before and after heat treatment when increasing the temperature at a heating rate of 10° C./min from 25° C. to 300° C. by differential scanning calorimetry (DSC), and then dividing the residual amount of generated heat having decreased during the heat treatment by the residual amount of generated heat before the heat treatment.

In the present invention, a Tg represents a peak temperature of tan δ measured at a frequency of 1 Hz and a heating rate of 5° C. by a dynamic viscoelasticity analyzer. The Tg after curing can be measured, for example, by using a cured material obtained by laminating a 36 μm-thick copper foil to one side of an adhesive layer formed from the adhesive composition to prepare an adhesive layer with copper foil, then curing the adhesive layer, and removing the copper foil completely by etching.

If the Tg after curing is lower than −10° C., an adhesive layer to be obtained is high in tackiness, and handling property and insulation reliability deteriorate. It is preferably 0° C. or higher. On the other hand, if the Tg exceeds 50° C., the thermal stress relaxation effect under a thermal cycle environment deteriorates and, therefore, separation of an adhesive layer from an object to be adhered caused by interface distortion generated therebetween or cracking of the adhesive layer occurs, resulting in deterioration of thermal cyclability. It is preferably 30° C. or lower.

Moreover, the rate of change of Tg after the adhesive composition after curing is further heated at 175° C. for 1000 hours must be 15% or less. The rate of change of Tg is represented by $((Tg^2-Tg^1)/Tg^1) \times 100(\%)$ from the absolute temperature ($Tg^1$) of the glass transition temperature of the adhesive composition after curing and the absolute temperature ($Tg^2$) of the glass transition temperature of the adhesive composition after additional heat treatment at 175° C. for 1000 hours. An example of a method of heat treatment at 175° C. is a method including curing an adhesive layer of an adhesive layer with a copper foil by the aforementioned method, leaving it for 1000 hours in an oven of 175° C. while keeping the face in which the adhesive layer is exposed disposed in the air, subsequently removing the copper foil layer entirely by etching, and heat treating the removed face under the same condition. If the rate of change of Tg after heat treating at a temperature of 175° C. for 1000 hours exceeds 15%, the adhesion durability under a long-term high temperature condition deteriorates, and separation of the adhesive layer from an object to be adhered caused by heating or cracking of the adhesive layer occurs. It is preferably 12% or less, and more preferably from 0.1% to 10%.

Both the storage elastic modulus at 30° C. after curing and the storage elastic modulus at 30° C. after further heating at 175° C. for 1000 hours of the adhesive composition of the present invention are preferably from 0.1 MPa to 100 MPa. Like the Tg after curing, the storage elastic modulus after curing of an adhesive composition is indicative of the change of the thermal stress relaxation effect and the insulation reliability under a thermal cycle environment. Moreover, a state after heat treatment at 150° C. for 10000 hours, which is required in the fields of a power device and the like, is reproduced by carrying out heat treatment at 175° C. for 1000 hours.

The storage elastic modulus can be determined by dynamic viscoelasticity measurement like the aforementioned Tg. When the storage elastic modulus after curing is 0.1 MPa or more, the insulation reliability increases more. It is preferably 1 MPa or more, and more preferably 5 MPa or more. When the storage elastic modulus after curing is 100 MPa or less, the initial adhesive force and the thermal cyclability increase more. It is preferably 50 MPa or less, more preferably 40 MPa or less, and even more preferably 20 MPa or less. When the storage elastic modulus after heating at 175° C. for 1000 hours is 0.1 MPa or more, it is possible to control the occurrence of seepage of an adhesive layer under a heating environment at 175° C. It is preferably 1 MPa or more, and more preferably 3 MPa or more. On the other hand, when the storage elastic modulus after heating at 175° C. for 1000 hours is 100 MPa or less, the adhesion durability increases more. It is preferably 50 MPa or less, and more preferably 40 MPa or less. When both the storage elastic modulus after curing and the storage elastic modulus after heating at 175° C. for 1000 hours are 100 MPa or less, the adhesion durability and the thermal cyclability increase more.

The adhesive composition of the present invention contains (a) a thermoplastic resin, (b) an epoxy resin, (c) a hardener, and (d) an organopolysiloxane.

Examples of the organopolysiloxane (d) include a silicone oil, a silicone resin, and a silicone intermediate. The silicone oil is a bifunctional siloxane having a molecular weight being greater than 100,000. The silicone resin is a silicone that has a molecular weight being greater than 100,000 and that has a three-dimensional network structure containing a trifunctional or tetrafunctional siloxane unit as a primary component, and it includes a combination of a bifunctional siloxane unit and a trifunctional or tetrafunctional siloxane unit as well. The silicone intermediate is a substance lower in molecular weight than the silicone oil or the silicone resin and refers to a substance having a molecular weight of 100,000 or less. These may be in the form of a fine particle.

In order to bring the Tg of an adhesive composition into the range of the present invention, it is effective, for example, to use an organopolysiloxane containing at least one functional group selected from the group consisting of a hydroxyl group, an epoxy group, an alkoxyl group, a vinyl group, a silanol group, a carboxyl group, an amino group, an oxetanyl group, and a hydrosilyl group as the organopolysiloxane (d). Possession of these functional groups makes it possible to increase the initial adhesive force and to reduce the rate of Tg change under a long-term high temperature condition. Generally, an organopolysiloxane with a low molecular weight has a property of sublimating when the organopolysiloxane is exposed to high temperature conditions. Therefore, it is presumable that because of the use of an organopolysiloxane having a functional group, the organopolysiloxane bonds to a thermoplastic resin or to an epoxy resin or the organopolysiloxane bonds itself, so that it is possible to control the sublimation of the organopolysiloxane under a high temperature condition, thereby reducing the rate of Tg change. Moreover, since these functional groups serve as reaction points, so that a crosslinked structure can be formed, it is possible to control the storage elastic modulus after curing to a higher modulus side. An epoxy group, an alkoxyl group, a vinyl group, a silanol group, or a hydrosilyl group is preferable as a functional group.

Examples of an organopolysiloxane having a functional group are provided below. Two or more of organopolysiloxanes different in the functional groups may be used.

(i) Silicone Oil (the Following are Produced by Dow Corning Toray Co., Ltd.)

Dimethylsilicone oil (containing a silanol group; BY16-873), alcohol-modified silicone oil (containing a hydroxyl group; BY16-201), epoxy-modified silicone oil (containing an epoxy group; SF8413, BY16-855D, BY16-839, SF8421), phenol-modified silicone oil (containing a hydroxyl group; BY16-752, BY16-799), carboxy-modified silicone oil (containing a carboxyl group; BY16-880, BY16-750), methacrylate-modified silicone oil (containing a vinyl group; BY16-152D, BY16-152, BY16-152C), and amino-modified silicone oil (containing an amino group; SF8417, BY16-871) are listed as examples.

(ii) Silicone Intermediate and Silicone Resin

Methacryl-modified silane (containing a vinyl group; DMS-V05, DMS-V22, DMS-V52, PVD-0325, PVD-0525, PVD-1641, FMV-4031), hydrosilyl-modified silane (containing a Hydrosilyl group; HMS-H03, HMS-082, HMS-992) (the foregoing are produced by Gelest, Inc.), 3037INTERMEDIATE (Mw=1000; containing a methoxy group, a phenyl group, and a methyl group; the methoxy group content is 18% by weight), 3074INTERMEDIATE (Mw=1400; containing a methoxy group, a phenyl group, and a methyl group; the methoxy group content is 17% by weight), Z-6018 (Mw=2000; containing a hydroxyl group, a phenyl group, and a methyl group; the hydroxyl value is 6% by weight), 217FLAKE (Mw=2000; containing a hydroxyl group, a phenyl group, and a methyl group; the hydroxyl value is 6% by weight), 233FLAKE (Mw=3000; containing a hydroxyl group, a phenyl group, and a methyl group; the hydroxyl value is 6% by weight), 249FLAKE (Mw=3000; containing a hydroxyl group, a phenyl group, and a methyl group; the hydroxyl value is 6% by weight), QP8-5314 (Mw=200; containing a methoxy group, a phenyl group, and a methyl group; the methoxy group content is 42% by weight), SR2402 (Mw=1500; containing a methoxy group and a methyl group; the methoxy group content is 31% by weight), AY42-161 (Mw=1500; containing a methoxy group and a methyl group; the methoxy group content is 25% by weight), AY42-162 (Mw=2500; containing a methoxy group and a methyl group; the methoxy group content is 33% by weight), and AY42-163 (Mw=4500; containing a methoxy group and a methyl group; the methoxy group content is 25% by weight) (the foregoing are produced by Dow Corning Toray Co., Ltd.) are listed as examples.

Further, examples include methoxy-modified resin (containing a methoxy group; SY231 (the methoxy group equivalent is 222), SY550 (the foregoing are produced by Wacker Asahikasei Silicone Co., Ltd.)), KC89 (the methoxy group content is 45% by weight), KR500 (the methoxy group content is 50% by weight), KR9218 (the methoxy group content is 15% by weight), and KR213 (the methoxy group content is 22% by weight) (the foregoing are produced by Shin-Etsu Chemical Co., Ltd.), silanol-modified resin (containing a silanol group; SY300 (the hydroxyl value is 3% by weight), SY409 (the hydroxyl value is 2.5% by weight), SY430 (the hydroxyl value is 5% by weight), IC836 (the hydroxyl value is 3.5% by weight) (the foregoing are produced by Wacker Asahikasei Silicone Co., Ltd.)), KR220L, KR242A, KR271, KR282 (Mw=100,000 to 200,000), KR300, KR311 (Mw=6000 to 10000, the hydroxyl value is 4.5% by weight), KR212 (Mw=2000 to 3000, the hydroxyl value is 5% by weight), KR251, KR400, KR255, KR216, KR152 (the foregoing are produced by Shin-Etsu Chemical Co., Ltd.), 804RESIN (phenylmethyl-based), 805RESIN (phenylmethyl-based), 806RESIN (phenylmethyl-based), 840RESIN (phenylmethyl-based), SR2400 (methyl-based) (the foregoing are produced by Dow Corning Toray Co., Ltd.), and silsesquioxane derivatives (containing an oxetanyl group: OX-SQ, OX-SQ-H, OX-SQSI-20; containing a vinyl group: AC-SQ (the foregoing are produced by Toagosei Co., Ltd.)).

A preferable content of a functional group of these is 0.3 to 30% by weight in an organopolysiloxane. When it is 0.3% by weight or more, it is possible to increase the initial adhesive force and it is possible to further reduce the rate of change of Tg. It is more preferably 0.5% by weight or more. Moreover, when it is 30% by weight or less, it is possible to control the initial elastic modulus after curing to the lower modulus side. It is more preferably 20% by weight or less. When two or more of organopolysiloxanes different in the quantity of functional groups are contained, the quantity of the functional groups is expressed by an apparent average value.

An organopolysiloxane containing a bifunctional siloxane unit and a tri- or higher functional siloxane unit is particularly preferable. Inclusion of both a flexible bifunctional siloxane unit and a rigid trifunctional unit makes it possible to balance the initial adhesive force and the insulation reliability at a high level. It is desirable that the content of the bifunctional siloxane unit be 20 mol % or more because it is possible to increase initial adhesive force and to reduce the storage elastic modulus after heating at 175° C. for 1000 hours because of the fact that flexibility is high. It is more preferably 30 mol % or more. On the other hand, it is preferable that the content of a bifunctional siloxane unit be 90 mol % or less because it is possible to improve the insulation reliability more. It is more preferably 80 mol % or less. When two or more of organopolysiloxanes different in the content of a bifunctional siloxane unit are contained, the content is represented by an apparent average value. Moreover, from the viewpoint of further increasing the thermal cyclability under a long-term high temperature condition, it is more preferable that the bifunctional siloxane unit/trifunctional siloxane unit ratio (molar ratio) exceed 1.

It is desirable that a monovalent organic group having at least one member selected from the group consisting of a phenyl group, an alkyl group, an oxetanyl group, a vinyl group, a hydroxyl group, and an alkoxyl group be attached to a silicon atom of the organopolysiloxane. From the viewpoint of the compatibility with the thermoplastic resin (a) or the epoxy resin (b) and the viewpoint of further increasing the adhesion durability under a long-term high temperature condition, it is desirable to have a phenyl group and an alkyl group. The alkyl group is preferably an alkyl group having 1 to 18 carbon atoms, and examples thereof include a methyl group and a propyl group. It is desirable that the content of phenyl groups be 5 mol % or more based on the total amount of alkyl groups and phenyl groups because if so the compatibility with the thermoplastic resin (a) or the epoxy resin (b) is high and initial adhesive force increases. It is more preferably 10 mol % or more. On the other hand, it is desirable that the content be 70 mol % or less because if so it is possible to further reduce the rate of change of Tg. It is more preferably 60 mol % or less. When two or more of organopolysiloxanes different in the content of a phenyl group are contained, the content is represented by an apparent average value. On the other hand, from the viewpoint of increasing the crosslink density of an adhesive composition, it is desirable that an organic group having an alkoxyl group, a hydroxyl group or an oxetanyl group be attached.

The content of the organopolysiloxane (d) is preferably 30 parts by weight or more, more preferably 40 parts by weight or more, even more preferably 50 parts by weight or more, and still more preferably 100 parts by weight or more per 100 parts by weight of the thermoplastic resin (a) described later. If it is 30 parts by weight or more, it is possible to improve adhesion durability under a long-term high temperature condition and corrosion resistance of a circuit and to reduce migration. On the other hand, it is preferably 700 parts by weight or less, and more preferably 500 parts by weight or less. When it is 700 parts by weight or less, the initial adhesive force is excellent. Moreover, from the viewpoint of improving adhesion durability under a long-term high temperature condition and corrosion resistance of a circuit and reducing migration, the content is preferably greater than 20% by weight, more preferably 30% by weight or more, and even more preferably 40% by weight or more in the adhesive composition excluding a solvent. On the other hand, it is preferably 70% by weight or less, and more preferably 60% by weight or less.

The adhesive composition of the present invention contains at least one thermoplastic resin (a), the kind of which is not particularly limited. Thermoplastic resin has functions, such as flexibility, relaxation of thermal stress, and improvement in insulating property due to low water absorbing property. Examples of the thermoplastic resin include an acrylonitrile-butadiene copolymer (NBR), an acrylonitrile-butadiene-styrene resin (ABS), polybutadiene, styrene-butadiene-ethylene resin (SEBS), resin of an acrylic or methacrylic ester having a side chain having 1 to 8 carbon atoms (acrylic rubber), polyvinyl butyral, polyamide, polyester, polyimide, polyamideimide, and polyurethane. These may be in the form of a fine particle. Such a thermoplastic resin preferably has a functional group that can react with an epoxy resin (b) or a hardener (c), which are described below. Specific examples include an epoxy group, a hydroxyl group, a carboxyl group, an amino group, a vinyl group, a silanol group, and an isocyanate group. It is preferable because a bond to the epoxy resin (b) is strengthen by these functional groups, resulting in improvement in heat resistance.

Furthermore, from the viewpoint of compatibility with the organopolysiloxane of component (d), initial adhesive force to a material of a wiring board layer or the like, flexibility, and an relaxation effect of thermal stress, an acrylic or methacrylic ester having a side chain having 1 to 8 carbon atoms is used particularly preferably. It is preferable also for these polymers to have the aforementioned functional groups. This is because the crosslink density increases, which is advantageous in heat resistance and advantageously acts on the initial adhesive force.

The content of the aforementioned functional group is preferably 0.9 eq/kg or more in the thermoplastic resin (a), and the elastic modulus after curing and the Tg after curing can be controlled to appropriate ranges. The content is more preferably 1.0 eq/kg or more. On the other hand, it is preferably 3.0 eq/kg or less. Since the flexibility is high, it is possible to increase the initial adhesive force and to control the increase in rate of Tg change and in storage elastic modulus after heating at 175° C. for 1000 hours. It is more preferably 2.5 eq/kg or less, and even more preferably 1.6 eq/kg or less.

From the viewpoint of flexibility under a long-term high temperature condition, the weight average molecular weight (Mw) of the thermoplastic resin (a) is preferably 100,000 or more, more preferably 500,000 or more, and even more preferably 1,000,000 or more. The glass transition temperature (Tg) is preferably 20° C. or lower, more preferably 5° C. or lower, even more preferably −20° C. or lower, and still more preferably −30° C. or lower. When using two or more of thermoplastic resins, what is required is that the Mw and the Tg of at least one of the resins satisfy these ranges. The weight average molecular weight is measured by GPC (gel permeation chromatography) and calculated in terms of polystyrene. The Tg is calculated by a DSC method.

From the viewpoint of further improving the adhesion durability under a long-term high temperature condition, the content of the thermoplastic resin (a) is preferably 5% by weight or more, more preferably 20% by weight or more, even more preferably 30% by weight or more, and it is preferably 70% by weight or less, more preferably 60% by weight or less, and even more preferably 50% by weight or less, in the adhesive composition excluding a solvent.

Although the adhesive composition of the present invention contains at least one epoxy resin (b), the kind thereof is not particularly restricted. The epoxy resin is not particularly restricted if it is one that has two or more epoxy groups in one molecule, and examples thereof include diglycidyl ethers of bisphenol F, bisphenol A, bisphenol S, resorcinol, dihydroxynaphthalene, dicyclopentadienediphenol, dicyclopentadiene dixylenol, and the like, alicyclic epoxy phenoxy resins, such as epoxidized phenol novolac, epoxidized cresol novolac, epoxidized trisphenylol methane, epoxidized tetraphenylol ethane, epoxidized metaxylenediamine, cyclohexane epoxide, and the like, and phenoxy resins. Among these, a polyfunctional epoxy resin that has three or more epoxy groups in one molecule is used preferably in order to increase the crosslink density of the adhesive composition. By increasing the crosslink density by using a polyfunctional epoxy resin, it is possible to obtain an adhesive composition excellent in heat resistance, reflow resistance, film strength, and solvent resistance.

Examples of the polyfunctional epoxy resin include ortho-cresol novolac type, specifically, E180H65 produced by JER (Japan Epoxy Resins Co., Ltd.), ESCN195 produced by Sumitomo Chemical Co., Ltd., EOCN1020, EOCN102S, 103S, 1045 produced by Nippon Kayaku Co., Ltd., and the like; DPP novolac type, specifically, E157S65 produced by JER, and the like; trishydroxyphenyl methane type, specifically, EPPN501H produced by Nippon Kayaku Co., Ltd., and E1032 produced by JER, and the like; tetraphenylol ethane type, specifically, E1031S produced by JER, and the like; dicyclopentadiene phenol type, specifically, HP7200 produced by DIC (Dainippon Ink & Chemicals, Inc.), and the like; polyfunctional epoxy resins having a naphthalene structure, specifically, ESN185 produced by Nippon Steel Chemical Co., Ltd., YL6241 produced by JER, which has a special skeleton, and the like. Two or more of these epoxy resins may be used in combination.

Moreover, in order to impart fire retardancy, it is effective to use a halogenated epoxy resin, especially a brominated epoxy resin. From the viewpoint of achieving both the heat resistance and the fire retardancy of an adhesive composition at the same time, it is effective for the adhesive composition to contain a brominated epoxy resin and a non-brominated epoxy resin. Examples of the brominated epoxy resin include brominated phenol novolac type epoxy resins, such as a copolymerized type epoxy resin of tetrabromobisphenol A and bisphenol A, or "BREN"-S (produced by Nippon Kayaku Co., Ltd.). In consideration of the bromine content and the epoxy equivalent weight, two or more of these brominated epoxy resins may be used together. Recently, from the viewpoint of environmental impact, epoxy resins containing no halogen, specifically, phosphorus-containing epoxy resins and nitrogen-containing epoxy resins are used frequently. For imparting fire retardancy, such epoxy resins may be used.

In the adhesive composition of the present invention, it is desirable that the content of the epoxy resin (b) be 1 part by weight or more per 100 parts by weight of the thermoplastic resin (a) because the composition is excellent in initial adhesive force, and it is more desirable that the content be 3 parts by weight or more. Moreover, it is desirable that the content be 200 parts by weight or less because the durability of long-term adhesion is improved more, and it is more desirable that the content be 150 parts by weight or less.

The adhesive composition of the present invention contains the hardener (c). It has a function to realize the balance of physical properties, such as heat resistance, insulation reliability, chemical resistance, and adhesive layer strength, by curing any of the thermoplastic resin (a), the epoxy resin (b), and the organopolysiloxane (d). Examples of the hardener include known materials such as a phenol resin, a melamine resin, a maleimide resin, a xylene resin, a furan resin, a cyanate resin, and aromatic polyamines, e.g., 3,3',5, 5'-tetramethyl-4,4'-diaminodiphenylmethane, 3,3',5,5'-tetraethyl-4,4'-diaminodiphenylmethane, 3,3'-dimethyl-5,5'-diethyl-4,4'-diaminodiphenylmethane, 3,3'-dichloro-4,4'-diaminodiphenylmethane, 2,2',3,3'-tetrachloro-4,4'-diaminodiphenylmethane, 4,4'-diaminodiphenyl sulfide, 3,3'-diaminobenzophenone, 3,3'-diaminodiphenyl sulfone, 4,4'-diaminodiphenyl sulfone, 3,4'-diaminodiphenyl sulfone, 4,4'-diaminobenzophenone, and 3,4,4'-triaminodiphenylsulfone. Two or more of these may be used together. Particularly, phenol resin is preferable because it is excellent in insulation reliability.

As to the phenol resin, known phenol resins, such as a novolac type phenol resin and a resol type phenol resin, can be used. Particularly, a resol type phenol resin is preferable. Since a resol type phenol resin has a methylol group and undergoes a self-curing reaction, the heat resistance and the insulation reliability are further improved. Specific examples of the phenol resin include phenol, alkyl-substituted phenols, such as cresol, p-t-butyl phenol, nonyl phenol, and p-phenylphenol, cyclic alkyl-modified phenols, such as terpene and dicyclopentadiene, ones having a functional group containing a hetero atom, such as a nitro group, a halogen group, a cyano group, and an amino group, ones having such a skeleton as naphthalene and anthracene, polyfunctional phenols, such as bisphenol F, bisphenol A, bisphenol S, resorcinol, and pyrogallol, and co-condensates of two or more phenol compounds having different structures. Among these, a product obtained by co-condensing a phenol compound having an alkyl substituent and a phenol compound having crosslinking reaction sites is particularly preferable. A resol resin having crosslinking reaction sites has reaction sites at ortho-positions and para-positions and, therefore, can form a three-dimensional network to further improve the insulation reliability. On the other hand, a resol resin having an alkyl substituent has flexibility because the molecular weight thereof can be increased linearly and it can further improve the initial adhesive force. Examples of the resol resin having crosslinking reaction sites include phenol resol, bisphenol A resol, m-cresol resol, and p-phenylphenol.

The content of the hardener (c) is preferably 0.1 to 200 parts by weight per 100 parts by weight of the thermoplastic resin (a).

The adhesive composition of the present invention may contain (f) an inorganic filler, which can improve reflow resistance, workability, such as punchability, thermal conductivity, and fire retardancy. Examples thereof include silica, silicon nitride, silicon carbide, aluminum nitride, titanium nitride, titanium carbide, boron nitride, zirconium oxide, barium titanate, calcium zirconate, metal hydroxides, such as aluminum hydroxide, magnesium hydroxide, and calcium aluminate hydrate, metal oxides, such as zinc oxide, antimony trioxide, antimony pentoxide, aluminum oxide, magnesium oxide, titanium oxide, beryllium oxide, cobalt oxide, chromium oxide, and iron oxide, metal salts, such as calcium carbonate, calcium borate, calcium oxalate, magnesium carbonate, magnesium boronate, and calcium silicate, conductive fillers, such as gold, silver, copper, iron, nickel, graphite, carbon nanotube, and carbon black, and fillers, such as glass. Two or more of these may be used together. Particularly, silica, aluminum oxide, silicon nitride, silicon carbide, and aluminum hydroxide are used preferably. Silica is particularly preferable because of that it is advantageous in reflow resistance of an adhesive composition since silica has a thermal decomposition temperature being far higher than 300° C., that it is easy to control the fluidity, and the stability of particle diameter. Silica may be either amorphous or crystalline. Moreover, for the purpose of improving heat resistance, initial adhesive force, and the like, surface treatment may be applied to the inorganic filler by using a silane coupling agent, or the like. As to the silane coupling agent, those mentioned below may be used.

The shape of the inorganic filler (f) is not particularly limited. While it may be pulverization type, spherical form, and scaly form, and the like, pulverization type is preferred. The pulverization referred to herein is a shape that is not spherical (i.e., not round). Although the particle diameter of the inorganic filler is not particularly limited, an inorganic filler having an average particle diameter of 3 µm or less and a maximum particle diameter of 10 µm or less is used preferably from the viewpoint of dispersibility, applicability, reflow resistance, and thermal cyclability. Moreover, from the viewpoint of fluidity and dispersibility, inorganic fillers differing in average particle diameter may be used in combination. As to the measurement of the particle diameter, the measurement can be carried out using a Horiba LA500 laser diffraction particle size distribution analyzer. The average particle diameter referred to herein is defined by a particle diameter (median diameter) that corresponds to 50% when particle size distribution on the basis of a sphere-equivalent volume is measured and cumulative distribution is expressed by percent (%). The particle size distribution shall be expressed in 56-divided semilogarithmic representation (0.1 to 200 µm) of particle diameter on a volume basis. The maximum particle diameter is defined by a particle diameter that corresponds to 100% when the cumulative distribution is expressed by percent (%) in the particle size distribution defined by the average particle diameter. A sample for measurement shall be prepared by adding particles into ion exchange water so that clouding may be caused and then carrying out ultrasonic dispersion for 10 minutes. The measurement is carried out at a refractive index of 1.1 and a light transmittance in conformity with a standard value (about 70%, which has already set in an instrument).

The content of the inorganic filler (f) is preferably 2 to 60% by weight, and more preferably 5 to 50% by weight in the adhesive composition excluding the solvent.

The adhesive composition of the present invention may contain a coupling agent, and it is possible to increase the initial adhesive force to various metals such as copper, a rigid substrate, such as a glass epoxy substrate, and the like. Examples of the coupling agent include a silane coupling agent, a titanium coupling agent, a zirconia-based coupling agent, and a phosphorus-based coupling agent. Examples of the silane coupling agent include an alkoxyl group-containing silane that has a vinyl group, an epoxy group, a styryl group, an acryloxy group, an amino group, a methacryl group, a mercapto group, or an isocyanate group. The alkoxyl group is preferably a methoxy group or an ethoxy group.

The adhesive composition of the present invention may contain a catalyst for the purpose of making the thermoplastic resin (a), the epoxy resin (b), the hardener (c), or the organopolysiloxane (d) react. Examples of the catalyst for curing the epoxy resin (b) include an amine complex of boron trifluoride, such as a boron trifluoride triethylamine complex, imidazole derivatives, such as 2-alkyl 4-methylimidazole and 2-phenyl-4-alkylimidazole, organic acids, such as phthalic anhydride, trimellitic anhydride, and pyromellitic anhydride, triphenylphosphine, and dicyandiamide. Examples of the catalyst for making organopolysiloxanes (d) react together include platinum-based catalysts and peroxide-based catalysts.

It is not controlled at all to contain a corrosion inhibitor an antioxidant, an ion scavenger, etc. which control circuit corrosion or migration, in addition to the above-mentioned ingredients unless the properties of the adhesive are impaired. In particular, an adhesive composition to be stuck on a copper wiring portion preferably contains a corrosion inhibitor because the oxidative degradation of an adhesive by copper is promoted under a long-term high temperature condition.

As to the ion scavenger, inorganic ion exchangers different from the inorganic filler are used frequently. The use of these prevents the migration of wiring and can control the decrease of insulation resistance when being used for an insulation layer application.

The corrosion inhibitor is not particularly restricted if it is one that can control the corrosion of the metal to be used for wiring or the like and a migration phenomenon, and known corrosion inhibitors can be used. From the viewpoint of controlling corrosion to copper and migration, triazine derivatives, triazole derivatives, phenone derivatives, cyanoacrylic acid ester derivatives, salicylic acid ester derivatives, hindered amines (HALS), and the like are preferable. In particular, a heterocyclic azole compound (e) is preferable. Since a heterocyclic azole compound forms a rustproof layer on the surface of metal, such as copper, it increases the resistance to long-term high temperature when the adhesive composition of the present invention is laminated to copper. In some cases of a known adhesive composition, a heterocyclic azole compound (e) ceases to be supplied to the surface of metal because of the progress of a post-curing reaction of an adhesive caused by the exposure to a long-term high temperature condition, so that the rust prevention effect decreases, allowing the metal to be oxidized, and oxidative degradation of an adhesive layer occurs. Since the adhesive composition of the present invention contains the organopolysiloxane (d), it hardly undergoes a post-curing reaction even if it is exposed to a long-term high temperature condition and it becomes able to supply the heterocyclic azole compound to the surface of metal. It is presumable that, as a result of the above, it becomes possible to control oxidative degradation, resulting in further improvement in resistance to long-term high temperature.

Examples of the heterocyclic azole compound include diazole compounds, triazole compounds, tetrazole compounds, and thiazole compounds. Moreover, a homopolymer or copolymer that has such a structure in a side chain or the main chain of the polymer may be used. Among the heterocyclic azole compounds, benzotriazole compounds are preferable. Examples of the benzotriazole compound include benzotriazole, benzotriazole derivatives, and their salts. Two or more of these may be used together. The use of a benzotriazole derivative is preferable because the thermal decomposition temperature of benzotriazole itself becomes higher and therefore a rust prevention effect is demonstrated in a higher temperature range.

Examples of the benzotriazole or benzotriazole derivative include 1,2,3-benzotriazole, 4-methyl-benzotriazole, 5-methyl-benzotriazole, carboxybenzotriazole, nitro-1H-benzotriazole, 1H-benzotriazole, 1-[N,N-bis(2-ethylhexyl)aminomethyl]-4-methylbenzotriazole, 1-[N,N-bis(2-ethylhexyl)aminomethyl]-5-methylbenzotriazole, 2-(2-hydroxy-5-methylphenyl)-2H-benzotriazole, 2-(3,5-di-tert-phenyl-2-hydroxyphenyl)-2H-benzotriazole, 2-(2H-benzotriazol-2-yl)-4-methyl-6-(3,4,5,6-tetrahydrophthalimidomethyl) phenol, 2-(2-hydroxy-5-tert-octylphenyl)-2H-benzotriazole, and 2-(2-hydroxy-4-octylphenyl)-2H-benzotriazole.

Examples of the salt of benzotriazole or its derivative include a salt of benzotriazole or its derivative with an alkali metal, such as Na and K, and a salt with an amine, such asmonoethanolamine, diethanolamine, triethanolamine, cyclohexylamine, and isopropylamine. Specific examples include a benzotriazole monoethanolamine salt and a sodium salt of tolutriazole.

The content of the heterocyclic azole compound (e) is preferably 0.1 parts by weight or more, more preferably 1 part by weight or more, and even more preferably 2 parts by weight or more per 100 parts by weight of the thermoplastic resin (a), the epoxy resin (b), and the organopolysiloxane (d) in total. On the other hand, it is preferably 7 parts by weight or less, more preferably 5 parts by weight or less, and even more preferably 3 parts by weight or less.

The antioxidant is not particularly restricted if it imparts an antioxidation function and examples thereof include known antioxidants, such as phenol-based antioxidants, thioether-based antioxidants, phosphorus-containing antioxidants, and amine-based antioxidants. For resins having double bonds, such as NBR rubber, there is a tendency that crosslink of double bond portions proceeds slowly and, as a result, the adhesive layer becomes brittle when being left at high temperatures for a long period of time. The use of an antioxidant is effective because it can control such a reaction.

An inorganic ion exchanger is used frequently as the ion scavenger. An inorganic ion exchanger is (i) so high in ion selectivity that it can separate a specific ion from a system containing two or more kinds of ion, (ii) excellent in heat resistance, (iii) stable against organic solvents and resins, and (iv) excellent in oxidation resistance; therefore, it is effective for scavenging ionic impurities and is expected to inhibit insulation resistance from decreasing, prevent corrosion of aluminum wiring, and prevent generation of ion migration. There are a great many kinds of inorganic ion exchangers and they can be classified into 1) aluminosilicates (e.g., natural zeolite, synthetic zeolite, kaolin), 2) hydroxides or hydrous oxides (e.g., hydrous titanium oxide, hydrous bismuth oxide), 3) acid salts (e.g., phosphoric acid zirconium, titanium phosphate), 4) basic salts, mixed hydrous oxides (e.g., hydrotalcites, talc), 5) heteropolyacids (e.g., ammonium molybdophosphate) 6) hexacyanoiron(III) salts (e.g., hexacyanozinc), and 7) others. Commercial names include IXE-100, IXE-300, IXE-500, IXE-530, IXE-550, IXE-600, IXE-633, IXE-700, IXE-700F, and IXE-800 produced by Toagosei Co., Ltd. Although there are a cation exchanger, an anion exchanger, and a cation/anion exchanger, the cation/anion exchanger is preferred because there are both a cationic impurity and an anionic impurity in an adhesive composition. The use of these prevents the ion migration of wiring and can control the decrease of insulation resistance when being used for an insulation layer application.

The adhesive composition of the present invention may contain a solvent. Examples of the solvent include aromatic solvents, such as toluene, xylene and chlorobenzene, ketone solvents, such as methyl ethyl ketone and methyl isobutyl ketone, and aprotic polar solvents, such as dimethylformamide, dimethylacetamide and N-methylpyrrolidone. Two or more of these may be contained.

Figure 5:
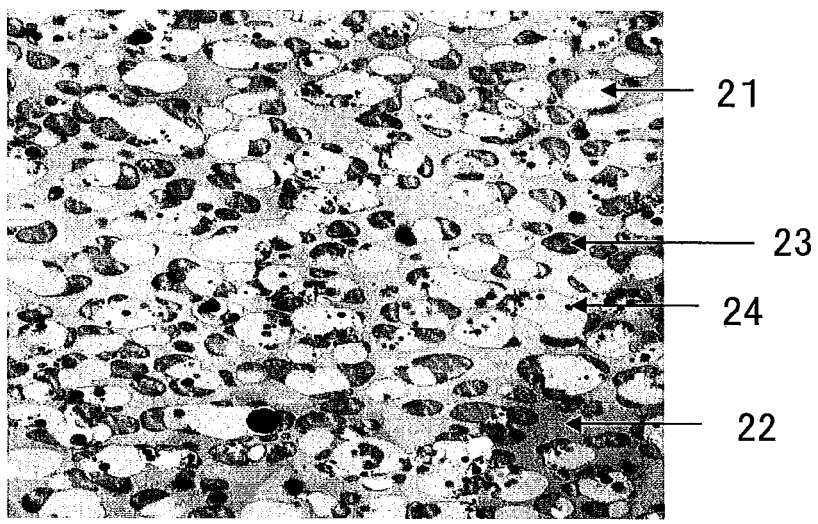
FIG. 5 is a phase separation structure of Example 33.

It is desirable that when the adhesive composition of the present invention is cured to a curing reaction ratio by differential scanning calorimetry measurement of 70% to 100%, the resulting composition have a sea-island structure containing island A containing the epoxy resin (b) as a primary component, island B containing the thermoplastic resin (a) as a primary component and sea C containing the organopolysiloxane (d) as a primary component, and the island A and the island B be in contact with each other. With reference to FIG. 5 for example, it can be observed that there is a phase separation structure composed of sea C22 containing the organopolysiloxane (d) as a primary component, island A21 containing the epoxy resin (b) as a primary component and island B23 containing the thermoplastic resin (a) as a primary component, and that the island A21 and the island B23 are in contact with each other. By forming a sea-island phase separation structure after curing and bring the island B containing the thermoplastic resin (a) as a primary component into contact with the island A containing the epoxy resin (b) as a primary component, it is possible to relax the strain generated at the interface of the island A under a high temperature condition through the contact with the island B. Moreover, it is possible to inhibit the epoxy resin (b) from flocculating and it is presumable that long-term adhesion durability, especially thermal cyclability, can be further improved. The primary component referred to herein means a component accounting for 50% by weight or more of the components forming the focused island or sea.

In order to obtain such a phase structure, it is desirable that the thermoplastic resin (a) and the epoxy resin (b) be incompatible. Furthermore, it is desirable that the thermoplastic resin (a) have a functional group capable of reacting with the epoxy resin (b). Among thermoplastic resins (a), an acrylic resin increase the flexibility of an adhesive composition and is excellent in initial adhesive force to a material of a wiring board layer or the like and in thermal stress relaxation effect. Therefore, it is desirable that an acrylic resin be the primary component of the island B. Whether the thermoplastic resin (a) and the epoxy resin (b) are compatible or not it is judged as follows. The thermoplastic resin (a) and the epoxy resin (b) are dissolved in a solvent at a weight ratio of 1/1 and then applied to a base material. After drying the solvent to form a film, the haze of the film heated at 170° C. for 2 hours is measured. When the haze is 10% or more, the resins are judged to be incompatible.

It is desirable that two or more islands B are in contact with a single island A. If so, the strain applied to the interface of the island A is fully relaxed by the islands B, so that the thermal cyclability and the long-term adhesion durability of adhesiveness can be further improved. When there is a large portion where the island A and the island B are in contact, the strain applied to the interface of the island A is fully relaxed by the islands B, so that the thermal cyclability and the long-term adhesion durability of adhesiveness can be further improved. Therefore, it is desirable that island A be in contact with island B over 10% or more of the perimeter of the island A. The number of the islands B in contact with the single island A is defined to be the mean value of the number of islands B in contact with each island A obtained by observing 10 islands A arbitrarily chosen from an observed image to be obtained by a transmission electron microscope using the observation method described below. The perimeter of each of 10 islands A arbitrarily chosen from an observation image obtained by a transmission electron microscope under the conditions mentioned below, and the ratio of the length of a peripheral portion in contact with the island B are measured, and then the ratio of the contact portion to the perimeter is calculated. The mean value of the ratios is defined as the ratio of the length of the portion in contact with the island B to the perimeter of the island A.

When the adhesive composition contains an inorganic filler (f), it is desirable that the inorganic filler be localized in the island A in the above-described phase structure. With reference to FIG. 5 for example, it can be observed that an inorganic filler 24 is localized in island A21 containing an epoxy resin as a primary component. The localization of the inorganic filler in the island A makes it possible to hold the stress relaxation property of a thermoplastic resin. Therefore, it is possible to further improve the initial adhesive force, the adhesion durability, and the thermal cyclability without reducing the reflow resistance. The localization of the inorganic filler in the island A means that the majority of the inorganic filler is present in the island A.

Hereafter, the method of observation of the sea/island structure after curing of the adhesive composition in the present invention is described.

First, the adhesive composition is cured to a curing reaction ratio by differential scanning calorimetry of 70% to 100%. The curing reaction ratio can be adjusted to a range of 70% to 100% by controlling the heating temperature and heating time of the adhesive composition appropriately.

The curing reaction ratio determined by differential scanning calorimetry can be determined by measuring the amount of generated heat of a sample before curing, Q1 (mJ/mg), and the amount of generated heat of a sample after curing, Q2 (mJ/mg), and calculating the ratio from "the reaction ratio (%)=((Q1−Q2)/(Q1)×100." The amount of generated heat can be measured by using an instrument DSC6200 manufactured by Seiko Instruments Inc. (SII NanoTechnology Inc.), at a temperature of 25° C. to 350° C., a heating rate of 10° C./min, a sample amount of about 10 mg, and a nitrogen gas flow of 40° C./min using an Al open pan.

Next, as to the cured adhesive composition, a macromolecular component is stained by the ruthenium acid staining technique. An ultrathin sample having a width of 100 to 900 μm and a length of up to 100 μm is cut and it is observed by a transmission electron microscope (e.g., H-7100FA manufactured by Hitachi, Ltd.) at an acceleration voltage of 100 kV and a magnification of 10,000 to 40,000 times. A phase separation structure of a 5 μm-square portion arbitrarily chosen from the resulting observation image is observed.

In order to identify the component forming each phase, a model experiment is effective. For example, it is possible to determine what phase is formed of the component to be identified by comparing the structure of an adhesive composition excluding the component to be identified and the structure of an adhesive component including the component.

One example of the method for producing the adhesive composition of the present invention is provided. A thermoplastic resin (a), an epoxy resin (b), a hardener (c), an organopolysiloxane (d) and, as necessary, an additive, such as a curing catalyst, are added to a solvent and then stirred, for example, at 30° C. for 1 to 8 hours, so that a solution of an adhesive composition is obtained.

An example of a preferable method for producing an adhesive composition that forms the aforementioned sea/island phase separation structure is provided below. <1> A thermoplastic resin (a), an epoxy resin (b) and, as necessary, a curing catalyst are stirred, for example, at 60 to 100° C. for 1 to 12 hours in the presence of a solvent. In this stage, conditions are adjusted so that the reaction ratio of the thermoplastic resin (a) and the epoxy resin (b) may become 5 to 50%. Subsequently, <2> a hardener (c), an organopolysiloxane (d) and, as necessary, a curing catalyst and an additional solvent are added and stirred, for example, at 30° C. for 1 to 8 hours, so that a solution of an adhesive composition is obtained. The reaction ratio of the thermoplastic resin (a) and the epoxy resin (b) can be determined by measuring the amount of generated heat of a sample before curing, Q3 (mJ/mg), and the amount of generated heat of a sample after curing, Q4 (mJ/mg), by differential scanning calorimetry and calculating the ratio from "the reaction ratio (%)=((Q3−Q4)/(Q3)×100." As to the sample before reaction, a sample is used which is obtained at a time when the thermoplastic resin (a) and the epoxy resin (b) used in <1> are stirred at 40° C. or lower in the presence of a solvent to dissolve. The sample after reaction refers to the sample in the stage <1>. The solids deposited by drying the respective solutions before and after the reaction under reduced pressure at 50° C. or lower are measured by differential scanning calorimeter. The measurement conditions are an instrument DSC6200 manufactured by Seiko Instruments Inc. (SII NanoTechnology Inc.), at a temperature of 25° C. to 350° C., a heating rate of 10° C./min, a sample amount of about 10 mg, and a nitrogen gas flow of 40° C./min using an Al open pan.

When the adhesive composition contains an inorganic filler (f), the following production method is preferred in order to make the inorganic filler (f) localized in the island A. <1> After the inorganic filler (f) is mixed with a solvent, ball mill treatment is carried out, thereby preparing a dispersion liquid. <2> An epoxy resin (b) and, as necessary, a curing catalyst are added and then stirred, for example, at 60 to 100° C. for 1 to 12 hours in the presence of a solvent. In this stage, conditions are adjusted so that the reaction ratio of the epoxy resin (b) may become 5 to 30%. Subsequently, <3> a thermoplastic resin (a) that is incompatible with the epoxy resin (b) is added and stirred, for example, at 60 to 100° C. for 1 to 12 hours. In this stage, conditions are adjusted so that the reaction ratio of the thermoplastic resin (a) and the epoxy resin (b) may become 5 to 50%. Subsequently, <4> a hardener (c), an organopolysiloxane (d) and an additional solvent are added and stirred, for example, at 30° C. for 1 to 8 hours, so that a solution of an adhesive composition is obtained. In this method, both the reaction ratio of the stage <1> and the reaction ratio of the stage <2> are calculated by differential scanning calorimetry in the same manner as in the above. As to the sample before reaction to be used for the reaction ratio measurement in the stage <2>, a sample is used which is obtained at a time when the epoxy resin (b) and the inorganic filler (f) are stirred at 40° C. or lower in the presence of a solvent and the resin dissolves. The sample after reaction refers to the sample in the stage <2>. As to the sample before reaction to be used for the reaction ratio measurement in the stage <3>, a sample is used which is obtained at a time when the thermoplastic resin (a) is added to the solution obtained in <2> and stirred at 40° C. or lower to dissolve. The sample after reaction refers to the sample in the stage <3>. The solids deposited by drying the respective solutions before and after the reaction under reduced pressure at 50° C. or lower are measured by differential scanning calorimeter. The measurement conditions are the same as those described above.

The adhesive sheet for electronic components (henceforth, adhesive sheet) of the present invention refers to an object that has an adhesive layer made of an adhesive composition of the present invention and at least one protective film layer that can be peeled. For example, a two-layer structure of protective film layer/adhesive layer or a three-layer structure of protective film layer/adhesive layer/protective film layer corresponds to this. Layers other than the adhesive layer and the protective film layer may be contained and, for example, a structure of protective film layer/adhesive layer/polyimide film/adhesive layer/protective film layer is also listed. As to the adhesive sheet, the degree of cure of the adhesive layer before curing, i.e., in a B stage state may be controlled by heat treatment. The control of the degree of cure has an effect of preventing excessive flow of an adhesive in adhering the adhesive sheet to an object to be adhered, such as a wiring board or an IC, and preventing foaming caused by moisture in heat curing. The thickness of the adhesive layer, which may be selected appropriately depending upon the relationship between the elastic modulus and the linear expansion coefficient of the layer, is preferably 2 to 500 μm and more preferably 5 to 400 μm.

The protective film layer referred to herein is not particularly restricted to the extent that it can be peeled before lamination of the adhesive layer to an object to be adhered with damaging neither the form nor the function of the adhesive layer, examples thereof include films of plastics, such as polyester, polyolefin, polyphenylene sulfide, polyvinyl chloride, polytetrafluoroethylene, polyvinylidene fluoride, polyvinyl fluoride, polyvinyl butyral, polyvinyl acetate, polyvinyl alcohol, polycarbonate, polyamide, polyimide, polymethyl methacrylate, and silicone rubber, films resulting from application of coating treatment to those films with a releasing agent, such as silicone or a fluorine compound, or papers with those films laminated, and papers impregnated or coated with a releasable resin. It is more desirable that the protective film layer is colored. In this case, since whether the protective film is peeled can be checked visually, it is possible to prevent forgetting to peel the layer.

In the case of having protective film layers on both sides of the adhesive layer, when the peeling forces of the respective protective film layer are $F_1$ and $F_2$ ($F_1 > F_2$) ($F_1 - F_2$) is preferably 5 $Nm^{-1}$ or more, and more preferably 15 $Nm^{-1}$ or more. Bringing it into this range makes it possible to peel the protective film layers one after another stability. Both the peeling forces F1 and F2 are preferably 1 to 200 $Nm^{-1}$, and more preferably 3 to 100 $Nm^{-1}$. When being 1 $Nm^{-1}$ or more, it is possible to prevent the protective film layers from exfoliating spontaneously; when being 200 $Nm^{-1}$ or less, it is possible to peel them stably.

In the adhesive sheet of the present invention, it is desirable that the shear strength of the adhesive layer after heating be 5 MPa or more because if so, delamination hardly occurs in handling of a package or reflowing. The shear strength is more preferably 10 MPa or more. The shear strength can be measured at a rate of 0.120 mm/sec at room temperature by using a Bond Tester SS-30WD (with a 50 kg load cell) manufactured by Seishin Trading Co., Ltd. Specifically, after laminating an adhesive sheet of the present invention on a rear face of a pattern tape 20 for evaluation under a condition of 130°

Figure 4:
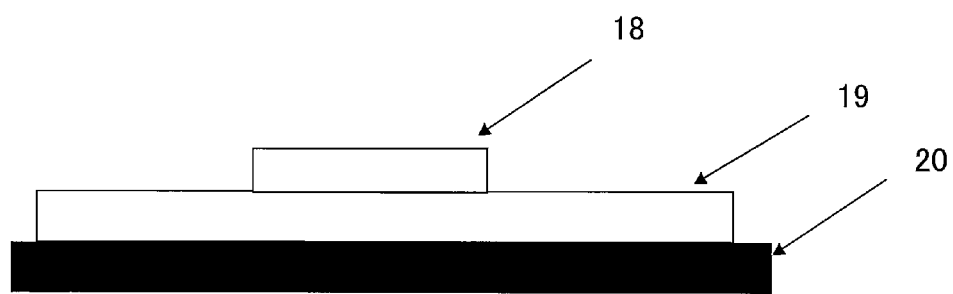
FIG. 4 is a schematic view of a sample for evaluation.

C., 0.5 MPa and 0.3 m/min as illustrated in FIG. 4, a protective film layer is peeled and then a 2 mm-square silicon wafer 18 is attached to an adhesive layer 19 by application of heat and pressure under conditions of 130° C., 3 MPa, and 10 seconds. Subsequently, heat curing treatment is carried out at 150° C. for 2 hours in an air oven and the shear strength of the obtained sample is measured under the aforementioned conditions.

The adhesive composition and the adhesive sheet of the present invention are used suitably for (1) a substrate for semiconductor connection to be used in mounting a semiconductor element or a semiconductor integrated circuit for a wiring board (i.e., interposer), such as a tape automated bonding (TAB)-type pattern processing tape and an interposer for a ball grid bonding (BGA) package, (2) a lead frame fixing tape and a lead on-chip (LOC) fixing tape, (3) a die bonding material for bonding an electronic component, such as a semiconductor element, and a supporting member, such as a lead frame and an insulating supporting substrate, (4) adhesives, such as a heat spreader (a radiator plate), a stiffener (a reinforcement plate), and a shield material, (5) a sealing material of an electronic device, (6) adhesives for optical use, such as an adhesive for optics, such as an adhesive for light path coupling, an adhesive for assembling an optical component, and a sealing material for LED (Light Emitting Diode), (7) various kinds of electronic materials, such as a solder resist, an anisotropic conductive film, a copper-lined laminated board, a cover lay, and an insulating layer between circuits. The shape and the material of an object to be adhered are not particularly limited.

In particular, the adhesive composition and the adhesive sheet of the present invention can be used particularly suitably as an insulating layer or adhesive layer for a power device.

A sectional view of one embodiment of a BGA-type semiconductor device in which an adhesive sheet of the present invention is used is depicted in FIG. 1. A semiconductor integrated circuit (a bare chip) 1 cut after an element is formed on a semiconductor substrate such as silicon is adhered to a substrate for connecting a semiconductor integrated circuit 5 with an adhesive layer 2. The substrate for connecting a semiconductor integrated circuit 5 has a conductor pattern 4 on one side or both sides of an insulator layer 3. This conductor pattern 4 is used for connecting an electrode pad to an external part (e.g., a printed circuit board and a TAB tape) of a package. Moreover, the semiconductor integrated circuit 1 and the substrate for connecting a semiconductor integrated circuit 5 are connected with a bonding wire 6. A solder ball 7 is mounted to the conductor pattern 4, and the connection portion between the bonding wire 6 of the semiconductor integrated circuit 1 and the substrate for connecting a semiconductor integrated circuit 5 is covered with a sealing resin 8.

As the insulator layer 3, a plastic, such as polyimide, polyester, polyphenylene sulfide, polyethersulfone, polyetheretherketone, aramid, polycarbonate, and polyarylate, a composite material, such as epoxy resin impregnated glass cloth, a flexible insulation film having a thickness of 10 to 125 μm made of a graphite sheet or the like, or a ceramic substrate, such as alumina, zirconia, SiC, GaN, soda glass, and quartz glass, is used suitably. A laminate resulting from laminating two or more of these also may be used. As necessary, surface treatment, such as hydrolysis, corona discharge, cold plasma, physical roughening, and easy-adhesive coating treatment, may be applied.

Figure 2:
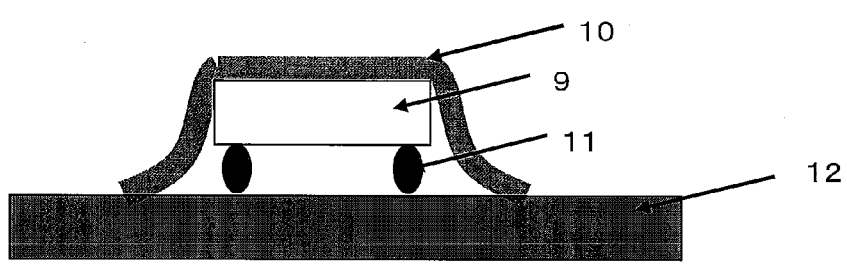
FIG. 2 is a sectional view of one embodiment of a sealing device using the adhesive sheet of the present invention.

In FIG. 2 is provided a sectional view of one embodiment of a sealing device using an adhesive sheet of the present invention. A semiconductor integrated circuit 9 with a solder ball 11 mounted is batch-sealed with an adhesive layer 10 on the insulator layer 12. In addition to the semiconductor integrated circuit 9, it can be used also for a device in which a substrate with irregularities, such as a substrate with an LED light emitting element or the like mounted, is sealed on an insulation layer. Moreover, a conductor pattern may also be formed directly on a sealed adhesive layer 10.

The adhesive sheet of the present invention is used suitably for, especially, a surface mount electronic component. The structure thereof has, on a substrate, a first conductive layer, a semiconductor integrated circuit, an adhesive layer being in contact with at least a part of the first conductive layer and at least apart of the semiconductor integrated circuit, and a second conductive layer that connects the first conductive layer and the semiconductor integrated circuit.

Figure 3:
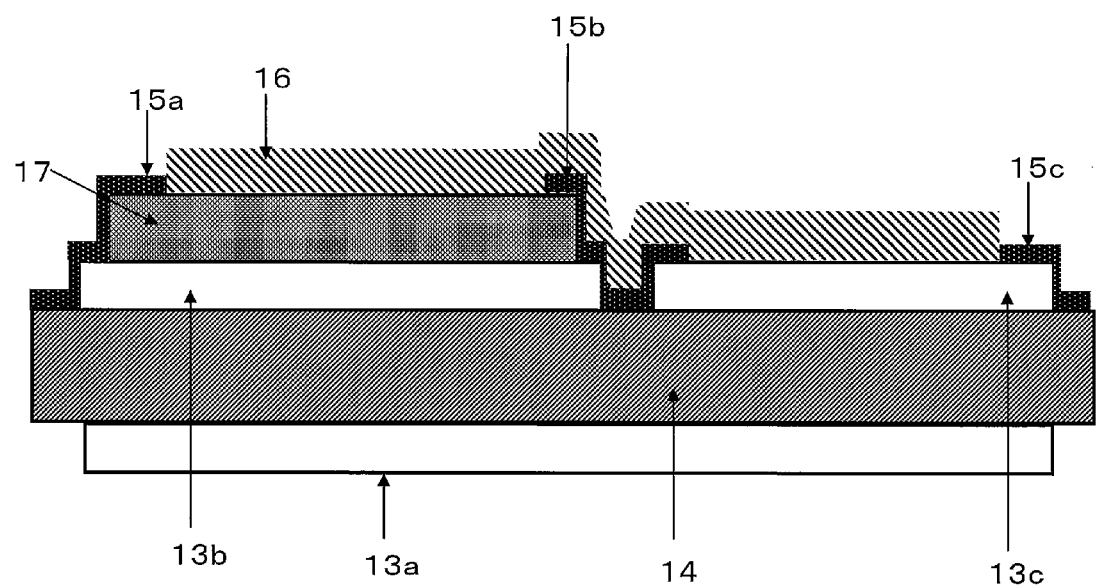
FIG. 3 is a sectional view of one embodiment of a surface mount electronic component using the adhesive sheet of the present invention.

In FIG. 3 is depicted a sectional view of one embodiment of a surface mount electronic component using an adhesive sheet of the present invention. On both faces of the ceramic substrate 14 is disposed first conductive layers 13a, 13b, and 13c, and on the conductive layer 13b, a semiconductor integrated circuit 17 is laminated. On the semiconductor integrated circuit 17, adhesive layers 15a and 15b being in contact with a part of the semiconductor integrated circuits 17 are laminated. On the other hand, on the first conductive layer 13c adhesive layers, 15b and 15c being in contact with part of the conductive layer 13c are laminated. Moreover, the semiconductor integrated circuit 17 and the first conductive layer 13c are connected together by a second conductive layer 16. The feature of this structure lies in that the connection reliability is kept high even if being exposed to a long-term high temperature condition because surface connection is formed unlike wire bonding. For example, if the semiconductor integrated circuit 17 is made of SiC, GaN, or the like, a long-term reliability of 200° C. or more is required. For conventional wire bonding, a wire portion might crack or break due to thermomechanical stress. On the other hand, for a surface mount electronic component, a high connection reliability can be obtained because the second conductive layer 16 is surface-connected.

The use of the adhesive composition or adhesive sheet of the present invention that is excellent in adhesion durability under a long-term high temperature condition, thermal cyclability, and insulation reliability for such a surface mount electronic component makes it possible to get the best performance. Moreover, one of the features of the adhesive sheet of the present invention is that good lamination property can be obtained in a surface mount system because the adhesive layer is so high in fluidity that it can follow irregularities by heat lamination.

Next, examples of the methods for producing an adhesive sheet and an electronic component using the adhesive composition of the present invention are described.

(1) Adhesive Sheet (a) A paint prepared by dissolving an adhesive composition of the present invention in a solvent is applied to a releasable polyester film with a bar coater, or the like, and then dried. The drying conditions are commonly 100 to 200° C. and 1 to 5 minutes.

(b) On the adhesive layer formed in (a) is laminated a releasable protective film layer made of polyester or polyolefin that is weaker in peel strength than that mentioned above, and thus an adhesive sheet of the present invention is obtained. The thickness of the adhesive layer can be further increased by laminating an adhesive layer twice or more by repeating the method described in the above (a). In another possible embodiment of the method described in the above (a), an insulation film is used instead of the polyester film and a protective layer is further laminated by laminating an adhesive layer on both sides of the insulation film. After the lamination, the degree of cure of the adhesive layer may be controlled, for example, by executing heat treatment at 30 to 70° C. for 20 to 200 hours.

(2) Electronic Component (A) BGA Type Semiconductor Apparatus (a) An electrolytic copper foil with a thickness of 12 to 35 μm is laminated on a tape with an adhesive for TAB under conditions of 130 to 170° C. and 0.1 to 0.5 MPa. Then, successive heat curing treatment at 80 to 170° C. is carried out in an air oven, so that a tape for TAB with a copper foil is prepared. The copper foil face of the resulting tape with a copper foil for TAB is subjected to photoresist film formation, etching, resist stripping, electrolytic nickel plating, and electrolytic gold plating, and solder resist film production by ordinary processes. Thus, a substrate for semiconductor integrated circuit connection is prepared.

The conductor pattern may be formed by using either of a subtractive process and an additive process. In the subtractive process, a pattern is formed by applying etching treatment with a chemical liquid to a laminated article prepared by adhering a metal foil, such as a copper foil, to an insulator layer with an insulation adhesive (the adhesive composition of the present invention can be used) or a laminated article prepared by laminating a precursor of an insulation layer to a metal plate and forming an insulator layer by heat treatment or the like. Examples of the laminated article to be used for this method include a copper-lined material for a rigid substrate, or a flexible print substrate and a TAB tape. On the other hand, in the additive process, a conductor pattern is formed on an insulator layer directly by electroless plating, electrolytic plating, sputtering, etc. In either case, highly corrosion-resisting metal may be plated to the formed conductor for corrosion prevention.

The thus produced substrate for connecting a semiconductor integrated circuit may, as necessary, have a via hole and the conductor patterns formed on both sides may be connected by plating.

(b) To the substrate for connecting a semiconductor integrated circuit prepared in (a) is adhered by application of heat the adhesive sheet obtained in (1), and further a semiconductor integrated circuit (IC) is attached by application of heat and pressure to the opposite side of the adhesive sheet. The adhesive sheet is usually laminated while being in a semicured state and the degree of cure thereof may be controlled by performing precuring at a temperature of 30 to 200° C. for an appropriate period of time after the lamination. Subsequently, heat curing at 120 to 180° C. is carried out. The heat curing is usually carried out in an air oven.

(c) The semiconductor integrated circuit and the substrate for semiconductor integrated circuit connection are connected by wire bonding under conditions of 150 to 250° C. at about 150 kHz, and then are sealed with resin.

(d) Finally, a solder ball is mounted by reflow to obtain an electronic component of the present invention.

(B) Electronic Component of Surface Mounting System (a) An adhesive sheet obtained in (1) is laminated on irregularities formed by disposing a first conductive layer and a semiconductor integrated circuit on one side or both sides of a ceramic substrate, and it is attached by application of heat and pressure at 120 to 180° C., thereby being batch-sealed. The degree of cure of the adhesive layer may be controlled after the lamination of the adhesive sheet. The first conductive layer may be formed by using either of a subtractive process and an additive process.

(b) At least part of the adhesive layer on the semiconductor integrated circuit and at least part of the adhesive layer on the first conductive layer are removed by YAG, carbon dioxide gas, UV laser, or the like. Subsequently, the circuit is heated at 120 to 180° C. for several hours, thereby heating the adhesive layer to cure.

(c) The surface is entirely subjected to copper sputtering, followed by electrolytic copper plating. Subsequently, etching processing is carried out to the electrolytic copper plated surface to form a second conductive layer, thereby obtaining an electronic component of the present invention. The formation of the second conductive layer is carried out by an additive process.

EXAMPLES

The present invention will be described below with reference to Examples, but the invention is not limited to these Examples. Before starting explaining Examples, the method for preparing a sample for evaluation and the method of evaluation are described.

(1) Preparation of Pattern Tape for Evaluation

To a tape with an adhesive for TAB (#7100, (type 31N0-00FS), produced by Toray Industries, Inc.), a 18 μm-thick electrolytic copper foil was laminated under conditions of 140° C., 0.3 MPa, and 0.3 m/minute. Then, heat curing treatment was carried out in an air oven successively at 80° C. for 3 hours, at 100° C. for 5 hours, and at 150° C. for 5 hours, so that a tape for TAB with a copper foil was prepared. On the copper foil face of the resulting tape for TAB with a copper foil, photoresist film formation, etching, resist stripping, electrolytic nickel plating, and electrolytic gold plating were carried out. Thus, a pattern tape for evaluation having a comb-shaped conductor pattern having a conductor width of 25 μm and a distance between conductors of 25 μm was prepared.

(2) Measurement of Storage Elastic Modulus

To a glossy face of an electrolytic copper foil (36 μm) having been cleaned in accordance with a standard procedure of copper foil face cleaning provided in JPCA-BM02 was laminated at 130° C., 0.5 MPa, and 0.3 m/minute an adhesive sheet (the thickness of an adhesive layer was 200 μm) from which one protective film layer had been peeled. Another protective film layer was peeled and the residue was cured at 100° C. for 1 hour, and at 170° C. for 2 hours. Subsequently, the copper foil was removed entirely by etching, and for the exposed adhesive layer a storage elastic modulus at 30° C. (i.e., initial elastic modulus) was measured under conditions, including a frequency of 1 Hz and a temperature raising rate of 5° C./minute by using a dynamic viscoelasticity analyzer. Moreover, the adhesive layer with a copper foil layer after being cured under the aforementioned conditions was left in an oven of 175° C. for 1000 hours with the face in which the adhesive layer was exposed disposed in the air. Subsequently, the copper foil layer was removed completely by etching, and the storage elastic modulus of an adhesive layer obtained by heating treatment under the same conditions as above was measured by using a dynamic viscoelasticity analyzer.

(3) Measurement of Glass Transition Temperature (Tg)

A sample was prepared in the same method as that described in the foregoing (2), and a glass transition temperature was measured from the peak temperature of a tan δ obtained by using the dynamic viscoelasticity analyzer. The glass transition temperature was defined as an initial glass transition temperature (Tg). Treatment was applied in the same manner also to a sample heated at 175° C. for 1000 hours and a glass transition temperature was measured. The rate of change of Tg is represented by $((Tg^2-Tg^1)/Tg^1) \times 100$ (%) from the absolute temperature ($Tg^1$) of the initial glass transition temperature and the absolute temperature ($Tg^2$) of the glass transition temperature of the adhesive layer after the heat treatment at 175° C. for 1000 hours.

(4) Evaluation of Adhesiveness (a) Initial Adhesive Force

An adhesive sheet (the adhesive layer was 200 μm in thickness), from which one protective film layer had been peeled, was laminated to a 0.5 mm-thick copper plate under conditions of 130° C. and 1 MPa. Then, another protective film layer of the adhesive sheet laminated to the copper plate was peeled, and the resulting adhesive sheet was laminated to a polyimide film (thickness=75 μm; "UPILEX" (registered trademark) 75S, produced by Ube Industries, Ltd.) under conditions of 130° C. and 1 MPa, and then heat treatment was carried out at 170° C. for 2 hours under a pressure of 0.5 MPa, so that a sample for evaluation was prepared. After slitting the polyimide film into a width of 5 mm, the polyimide film having a width of 5 mm was peeled to a direction of 90° at a rate of 50 mm/minute, and the adhesion force at this time was measured.

(b) Initial Shear Strength

To a rear face of a pattern tape for evaluation prepared by the method described in the foregoing (1), an adhesive sheet (the adhesive layer was 100 μm in thickness), from which one protective film layer had been peeled, was laminated under condition of 130° C., 0.5 MPa, and 0.3 m/minute. Then, a pattern tape for evaluation, from which the protective film layer of the adhesive sheet adhered to the rear face of the pattern tape had been peeled, was attached to a 2 mm-square silicon wafer face by application of heat and pressure under conditions of 130° C., 3 MPa, and 10 seconds. The resulting sample has a composition in which a silicon wafer 18 is laminated on a pattern tape 20 for evaluation with an intervention of an adhesive layer 19 as represented in FIG. 4. Heat curing treatment was applied to this sample in an air oven at 100° C. for 1 hour and at 170° C. for 2 hours, and then a shear strength was measured. As to the shear strength, a die shear strength was measured at room temperature at a rate of 0.120 mm/second by using a bond tester MODEL SS-30WD (load cell of 50 kg) manufactured by Seishin Trading Co., Ltd.

(c) Long-Term Adhesion Durability-1

To a glossy face of a 0.5 mm-thick copper plate having been cleaned in accordance with a standard procedure of copper foil face cleaning provided in JPCA-BM02 was laminated at 130° C., 0.5 MPa, and 0.3 m/minute a 200 mm-thick adhesive layer, forming a composition of the copper foil/the adhesive layer. Then, curing was carried out at 100° C. for 1 hour and at 170° C. for 2 hours. These were put into an air oven of 200° C. During the operations, the sample was observed at intervals of 50 hours until 500 hours. When peeling or crack of the adhesive layer developed, it was considered as N.G. (no good). Observation after 500 hours was carried out at intervals of 100 hours, and evaluation was continued until 2000 hours at most.

(d) Long-Term Adhesion Durability-2

Evaluation was carried out in the same manner as in the above (c) except for changing the temperature of an air oven from 200° C. to 180° C.

(e) Thermal Cyclability

To a rear face of a pattern tape for evaluation prepared by the method described in the foregoing (1), an adhesive sheet (the adhesive layer was 50 μm in thickness), from which one protective film layer had been peeled, was laminated with a roll under condition of 130° C., 0.5 MPa, and 0.3 m/minute. Then, a pattern tape for evaluation, from which the protective film layer of the adhesive sheet adhered to the rear face of the pattern tape had been peeled, was attached under conditions of 130° C., 3 MPa, and 10 seconds to a coated face of a silicon wafer (dummy wafer, 20 mm-square) that was likened to an IC. The curing of the adhesive was carried out at 100° C. for 1 hour and at 170° C. for 2 hours. A silicon wafer a mirror surface of which was coated with a polyimide coating agent (produced by Toray Industries, Inc.: SP341), which was then cured at 350° C. for 1 hour, was used.

Thirty samples for evaluation were prepared for each level and the samples were treated under a condition of holding at the lowest temperature and the highest temperature of −65° C. to 150° C. for 45 minutes, respectively, in a heat cycle tester (Model PL-3, manufactured by Tabai ESPEC Corp.) and thus the development of peeling was evaluated. The sample was taken out at 100-cycle intervals and the development of peeling was evaluated by using an ultrasonic defect detector. When peeling was found in any one among the 30 samples, the samples were considered as N.G. (no good). Evaluation was continued to 1800 cycles, at most.

(f) Thermal Cyclability after a Long-Term Adhesion Durability Test

A copper foil/adhesive layer layered article having been subjected to heat treatment for 500 hours in an air oven of 200° C. by the method described in the above (c) was treated under a condition of holding at the lowest temperature and the highest temperature of −65° C. to 150° C. for 20 minutes, respectively, in the apparatus described in the above (e). The sample was observed at 500-cycle intervals. When peeling of the adhesive layer developed, it was considered as N.G. (no good).

(5) Insulation Reliability a) Dielectric Breakdown Voltage

To a 50-μm thick adhesive layer was applied a voltage at a constant rate for 10 to 20 seconds in average in accordance with JIS C2110 (1994). A dielectric breakdown voltage was determined by dividing the voltage applied when dielectric breakdown occurred by the thickness of the specimen.

(b) Migration Property

One protective film layer of an adhesive sheet (the thickness of the adhesive layer was 50 μm) was peeled off, and the exposed adhesive layer was laminated to a polyimide film ("UPILEX" (registered trademark) 75S produced by Ube Industries, Ltd.) under conditions, 130° C., 0.5 MPa and 0.3 m/minute. Then another protective film layer was peeled off and an electrolytic copper foil with a thickness of 18 μm was laminated under conditions of 140° C., 0.3 MPa, and 0.3 m/minute. Subsequently, curing treatment was carried out in an air oven at 170° C. for 2 hours, so that a tape with a copper foil having a composition of copper foil/adhesive layer/polyimide film was prepared. On the copper foil surface of the resulting tape with a copper foil, photoresist film formation, etching, and resist stripping were carried out. Thus, a pattern tape for evaluation having a comb-shaped conductor pattern having a conductor width of 200 μm and a distance between conductors of 200 μm was prepared. The pattern appearance resulting from application of a voltage of 200 V to this pattern tape for 500 hours at 170° C. was observed by the use of a light microscope. The length over which migration grew from an electrode was defined as the amount of migration.

(c) Insulation Resistance Value

To a conductor patter face of a comb-shaped sample for evaluation having a conductor width of 50 μm and a distance between conductors of 50 μm taken from a pattern tape for evaluation prepared by the method described in the foregoing (1), a 0.1 mm-thick pure copper plate with a 50 μm-thick adhesive layer was laminated at 130° C. and 0.1 MPa, and then heat treatment was carried out in an air oven at 150° C.

for 2 hours. By the use of the resulting sample, under a continuous application of a voltage of 100 V in a thermohygrostat at 85° C. and 85% RH, a resistance value just after the application and a resistance value 400 hours after the application were measured.

(6) Reflow Resistance

To a rear face of a pattern tape for evaluation prepared by the method described in the foregoing (1), an adhesive sheet (the thickness of an adhesive layer was 12 μm and the thickness of a protective film layer was 38 μm) from which one protective film layer had been peeled was laminated at 130° C. and 0.1 MPa. Then a sample for evaluation with a structure depicted in FIG. 4 was prepared by using a semiconductor integrated circuit (dummy wafer, 20 mm on each side) likened to an IC. A silicon wafer a mirror surface of which was coated with a polyimide coating layer (produced by Toray Industries, Inc.: SP341), which was then cured at 350° C. for 1 hour, was used. The curing of the adhesive was carried out at 150° C. for 2 hours. Twenty 30 mm-square samples produced by this method were prepared for each level, subjected to moisture control under an atmosphere of 30° C., 70% RH for 192 hours, and made pass through an infrared reflow furnace of a maximum temperature of 265° C. for 15 seconds twice. Thus swell and peeling were confirmed and the number of peeled samples among the 20 samples was counted.

(7) Phase Structure Observation

Next, as to the cured adhesive composition, a macromolecular component was stained by the ruthenium acid staining technique. An ultrathin sample having a width of 100 μm to 900 μm and a length of up to 100 μm was cut and it is observed by a transmission electron microscope (e.g., H-7100FA manufactured by Hitachi, Ltd.) at an acceleration voltage of 100 kV and a magnification of 10,000 to 40,000 times. A phase separation structure of a 5 μm-square portion arbitrarily chosen from the resulting observation image was observed.

Referential Example 1

Synthesis of Organopolysiloxane A-1

To 120 g of methylsilicone oil (PDV-0325, produced by Gelest, Inc.) was mixed 2.3 g of a 35% aqueous sulfuric acid solution under nitrogen at room temperature for 9 hours. The mixture was left in a refrigerator overnight, diluted with ice water, and then neutralized at a temperature of 5° C. or lower by the addition of an aqueous sodium hydroxide solution. The mixture was extracted fully with ether and distilled after drying, so that methylsilicone oil having a hydroxyl group was obtained. Subsequently, epichlorohydrin in an amount 10-fold molar equivalent based on hydroxyl groups was added thereto. The mixture was heated and refluxed at 120° C. with stirring and 40% by weight sodium hydroxide in an amount two-fold molar equivalent with respect to hydroxyl groups was added dropwise over 4 hours. After the completion of the dropwise addition, heating was continued for 15 minutes to remove water completely, and then unreacted epichlorohydrin was removed by distillation. Subsequently, toluene was added and the crude product was dissolved therein. After removing salt by filtration, toluene was extracted completely by heating to 170° C. and 267 Pa (2 mmHg), so that organopolysiloxane A-1 having an epoxy group was obtained.

Reference Example 2

Synthesis of Organopolysiloxane (A-5)

Organopolysiloxane A-5 was obtained in the same manner as in Reference Example 1 except for using phenylmethylsilicone oil (PDV-1625 produced by Gelest, Inc.) instead of methylsilicone oil.

Referential Example 3

Synthesis of Organopolysiloxane (A-6)

Phenylsilicone Oil Having an Epoxy Group was Obtained in the same manner as in Reference Example 1 except for using phenylsilicone oil (PDS-9931 produced by Gelest, Inc.) instead of methylsilicone oil and adding epichlorohydrin in an amount equimolar equivalent to hydroxyl groups. Then, phenyldimethylsilane (SIP6729 produced by Gelest, Inc.) having hydrosilyl groups in an amount equimolar to unreacted hydroxyl groups, platinum-1,3-divinyl-1,1,3,3-tetramethyl-disiloxane complex (produced by Gelest, Inc.), and 1,3-divinyltetramethyldisiloxane were added so that the amount of each would become 200 ppm, obtaining organopolysiloxane S in which all the unreacted hydroxyl groups were alkyl-modified.

A product resulting from mixing the organopolysiloxane A-5 obtained in Reference Example 2 and the organopolysiloxane S in a weight ratio of 1:2 was named organopolysiloxane A-6.

Referential Example 4

Synthesis of Acrylic Resin B-4

A solution obtained by dissolving 0.025 g of azobisisobutyronitrile in 3 g of toluene was added dropwise under a nitrogen gas flow to a reaction solution obtained by dissolving 5.69 g of n-butyl methacrylate, 10.6 g of acrylonitrile, 0.90 g of glycidyl methacrylate, and 0.784 g of gamma-mercaptopropyltrimethoxysilane as a chain transfer agent in 8.49 g of toluene, and a reaction was carried out at 90° C. for 8 hours, so that acrylic resin B-4 was obtained.

Referential Example 5

Synthesis of Acrylic Resin B-5

Acrylic resin B-5 was obtained by carrying out the same operations as those of Referential Example 4 except for changing the amount of glycidyl methacrylate from 0.90 g to 1.4 g.

Referential Example 6

Synthesis of Acrylic Resin B-6

Acrylic resin B-6 was obtained by carrying out the same operations as those of Referential Example 4 except for changing the amount of glycidyl methacrylate from 0.90 g to 0.14 g.

Referential Example 7

Acrylic Resin B-7

Acrylic resin B-7 was obtained by carrying out the same operations as those of Referential Example 4 except for not using glycidyl methacrylate.

Referential Example 8

Acrylic Resin B-8

Acrylic resin B-8 was obtained by carrying out the same operations as those of Referential Example 4 except for changing the amount of glycidyl methacrylate from 0.90 g to 0.40 g.

Referential Example 9

Acrylic Resin B-9

Acrylic resin B-9 was obtained by carrying out the same operations as those of Referential Example 4 except for changing the amount of glycidyl methacrylate from 0.90 g to 0.54 g.

Referential Example 10

Acrylic Resin B-10

Acrylic resin B-10 was obtained by carrying out the same operations as those of Referential Example 4 except for changing the amount of glycidyl methacrylate from 0.90 g to 1.79 g.

Details of the organopolysiloxanes and the thermoplastic resins used for respective Examples and Comparative Examples are provided in Tables 1 and 2.

TABLE 1

| | | Organopolysiloxane (d) | | | |
|---|---|---|---|---|---|
| | | Functional group | | Trifunctional/ bifunctional | Phenyl group/ methyl group |
| | Name | Kind | Content (% by weight) | (molar ratio) | (molar ratio) |
| A-1 | See Referential Example 1 | Epoxy group | 5 | 70/30 | 0/100 |
| A-2 | KR9218, produced by Shin-Etsu Chemical Co., Ltd. | Methoxy group | 15 | 50/50 | 50/50 |
| A-3 | KR212, produced by Shin-Etsu Chemical Co., Ltd. | Silanol group | 5 | 50/50 | 50/50 |
| A-4 | KR152, produced by Shin-Etsu Chemical Co., Ltd. | Silanol group | 5 | 30/70 | 50/50 |
| A-5 | See Referential Example 2 | Epoxy group | 5 | 70/30 | 50/50 |
| A-6 | See Referential Example 3 | Epoxy group | 5 | 70/30 | 90/10 |
| A-7 | KR216, produced by Shin-Etsu Chemical Co., Ltd. | Silanol group | 5 | 100/0 | 50/50 |
| A-8 | AY42-161, produced by Shin-Etsu Chemical Co., Ltd. | Methoxy group | 36 | 50/50 | 50/50 |
| A-9 | SH510, produced by Dow Corning Toray Co., Ltd. | None | 0 | 0/100 | 25/75 |
| A-10 | DMS-V05, produced by Gelest, Inc. | Vinyl group | 8 | 0/100 | 0/100 |
| A-11 | HMS-031, produced by Gelest, Inc. | SiH group | 5 | 0/100 | 0/100 |

TABLE 2

| | | Thermoplastic resin (a) | | | |
|---|---|---|---|---|---|
| | | Functional group | | Tg | |
| | Name | Kind | Content (eq/kg) | (° C.) | Molecular weight |
| B-1 | XF3677, produced by Tohpe Corp. | Hydroxyl group | 0.19 | | 1,300,000 |
| B-2 | SG-P3, produced by Nagase ChemteX, Corp. | Epoxy group | 0.21 | 15 | 850,000 |
| B-3 | SG-708-6, produced by Nagase ChemteX, Corp. | Carboxyl group | 0.14 | −5 | 500,000 |
| B-4 | See Referential Example 4 | Epoxy group | 1.6 | −30 | 1,100,000 |
| B-5 | See Referential Example 5 | Epoxy group | 2.3 | −30 | 1,100,000 |
| B-6 | See Referential Example 6 | Epoxy group | 0.25 | −30 | 1,100,000 |
| B-7 | See Referential Example 7 | None | 0 | −30 | 1,100,000 |
| B-8 | See Referential Example 8 | Epoxy group | 0.7 | −30 | 1,100,000 |
| B-9 | See Referential Example 9 | Epoxy group | 0.95 | −30 | 1,100,000 |
| B-10 | See Referential Example 10 | Epoxy group | 3.2 | −30 | 1,100,000 |

Example 1

A thermoplastic resin, an epoxy resin, a hardener, an organopolysiloxane, and a curing catalyst were added to a mixed solvent of methyl ethyl ketone/toluene=2/1 (weight ratio) so that the resin composition ratio might become that provided in Table 3 and the solid content might become 20% by weight, and those were stirred and mixed at 30° C., so that an adhesive solution was produced. The adhesive solution was applied with a bar coater to a 38 μm-thick polyethylene terephthalate film ("Filmbyna" (registered trademark) GT produced by Fujimori Kogyo Co., Ltd.) with a silicone release agent so that a necessary dry thickness would be produced, and it was dried at 150° C. for 4 minutes. A protective film layer was then laminated, so that an adhesive sheet of the present invention was produced. Moreover, a storage elastic modulus, a glass transition temperature, adhesiveness, and insulation reliability were evaluated by the methods described above.

The protective film layer of the adhesive sheet produced by the above-mentioned method was peeled and the resulting adhesive sheet was laminated to a rear face of a pattern tape for evaluation prepared by the method described in the foregoing (1) under conditions of 130° C. and 0.1 MPa. Subsequently, the PET film of the adhesive sheet was peeled and an IC with an aluminum electrode pad was attached to the adhesive layer by application of heat and pressure under conditions of 170° C. and 0.3 MPa. Next, heat curing treatment was carried out at 150° C. for 2 hours in an oven. Subsequently, a 25-μm gold wire was bonded to this at 180° C., 110 kHz. Furthermore, the resulting item was sealed with a liquid sealing resin ("Chipcoat" 8118 produced by Namics Corp.). Finally, a solder ball was mounted to prepare a semiconductor apparatus with the structure of FIG. 1.

Examples 2 to 25

Comparative Examples 1 to 5

Adhesive sheets were produced and evaluated in the same manner as in Example 1 except for preparing adhesive solutions so that the resin composition ratios provided in Tables 3 to 6 might be produced.

Comparative example 6

A vinyl group-containing silane (DMS-V05 produced by Gelest, Inc.) and a hydrosilyl group-containing silane (HMS-031 produced by Gelest, Inc.) were mixed so that the equivalent ratio might become 1, and then platinum-1,3-divinyl-1,1,3,3-tetramethyl-disiloxane complex (produced by Gelest, Inc.) and 1,3-divinyltetramethyldisiloxane were added so that the contents thereof might become 200 ppm, respectively. After agitation, the resulting adhesive solution was applied to a 38-μm thick polysulfone film (produced by Mitsubishi Chemical Corp.) so that a film with a needed dry thickness might be formed, dried at 120° C. for 10 minutes, and laminated with a protective film layer. Thus an adhesive sheet was produced. Evaluation was carried out in the same manner as in Example 1 except for the above-mentioned operations.

The evaluation results in the Examples and the Comparative Examples are provided in Tables 3 to 6. The Examples and Comparative Examples provided above showed that since the adhesive composition for electronic components of the present invention had excellent adhesion durability also under high temperature conditions over a long period of time, excellent thermal cyclability and high insulation reliability, it could increase the reliability of a semiconductor apparatus using it.

TABLE 3

| | | Example | | | | | | |
|---|---|---|---|---|---|---|---|---|
| | | 1 | 2 | 3 | 4 | 5 | 6 | 7 |
| Thermo-plastic resin (a) | Upper line: kind | B-1 | B-2 | B-3 | B-4 | B-5 | B-6 | B-6 |
| | Lower line: content (parts by weight) | 100 | 100 | 100 | 100 | 100 | 100 | 100 |
| Epoxy resin (b) | Upper line: kind | EOCN102S | EOCN102S | EOCN102S | EOCN102S | EOCN102S | EOCN102S | EOCN102S |
| | Lower line: content (parts by weight) | 37 | 37 | 37 | 37 | 37 | 37 | 37 |
| Hardener (c) | Upper line: kind | CKM2400 | CKM2400 | CKM2400 | CKM2400 | CKM2400 | CKM2400 | CKM2400 |
| | Lower line: content (parts by weight) | 50 | 50 | 50 | 50 | 50 | 50 | 50 |
| Organopoly-siloxane (d) | Upper line: kind | A-3 | A-3 | A-3 | A-3 | A-3 | A-3 | A-1 |
| | Lower line: content (parts by weight) | 100 | 100 | 100 | 100 | 100 | 100 | 100 |
| Curing catalyst | Upper line: kind | 2EZ | 2EZ | 2EZ | 2EZ | 2EZ | 2EZ | 2EZ |
| | Lower line: content (parts by weight) | 0.3 | 0.3 | 0.3 | 0.3 | 0.3 | 0.3 | 0.3 |
| Glass transition temperature (Tg) | Initial (° C.) | 8 | 9 | 6 | 25 | 33 | 11 | 12 |
| | After 175° C. × 1000 h treatment (° C.) | 46 | 50 | 45 | 63 | 74 | 43 | 45 |
| | Rate of change (%) | 13.5 | 14.5 | 14.0 | 12.8 | 13.4 | 11.3 | 11.6 |
| Storage elastic modulus | Initial (MPa) | 5 | 5 | 3 | 18 | 52 | 4 | 3 |
| | After 175° C. × 1000 h treatment (MPa) | 46 | 49 | 42 | 78 | 142 | 45 | 61 |
| Adhesiveness | Initial adhesive force (N/cm) | 16 | 16 | 17 | 18 | 19 | 17 | 13 |
| | Long-term adhesion durability-1 (h) | 1300 | 1050 | 1200 | 1300 | 1100 | 1500 | 1300 |
| | Thermal cyclability (cycles) | 1500 | 1500 | 1500 | 1000 | 700 | 1400 | 1400 |
| | Thermal cyclability after long-term adhesion durability test | 350 | 300 | 300 | 250 | 200 | 350 | 300 |
| Insulation reliability | Breakdown voltage (kV/mm) | 80 | 90 | 80 | 125 | 145 | 95 | 90 |
| | Amount of migration (μm) | 10 | 5 | 5 | <5 | <5 | 5 | 5 |

EOCN102S: Cresol novolac type epoxy resin produced by Nippon Kayaku Co., Ltd.
CKM2400: p-tert-Bu type novolac resin produced by Showa Highpolymer Co., Ltd.
2EZ: 2-Ethylimidazole

TABLE 4

|  |  | Example 8 | Example 9 | Example 10 | Example 11 |
|---|---|---|---|---|---|
| Thermoplastic resin (a) | Upper line: kind | B-6 | B-6 | B-6 | B-6 |
|  | Lower line: content (parts by weight) | 100 | 100 | 100 | 100 |
| Epoxy resin (b) | Upper line: kind | EOCN102S | EOCN102S | EOCN102S | EOCN102S |
|  | Lower line: content (parts by weight) | 37 | 37 | 37 | 37 |
| Hardener (c) | Upper line: kind | CKM2400 | CKM2400 | CKM2400 | CKM2400 |
|  | Lower line: content (parts by weight) | 50 | 50 | 50 | 50 |
| Organopolysiloxane (d) | Upper line: kind | A-2 | A-4 | A-5 | A-6 |
|  | Lower line: content (parts by weight) | 100 | 100 | 100 | 100 |
| Curing catalyst | Upper line: kind | 2EZ | 2EZ | 2EZ | 2EZ |
|  | Lower line: content (parts by weight) | 0.3 | 0.3 | 0.3 | 0.3 |
| Glass transition temperature (Tg) | Initial (° C.) | 16 | 5 | 19 | 23 |
|  | After 175° C. × 1000 h treatment (° C.) | 54 | 28 | 53 | 64 |
|  | Rate of change (%) | 13.1 | 8.3 | 11.6 | 13.9 |
| Storage elastic modulus | Initial (MPa) | 15 | 1 | 7 | 21 |
|  | After 175° C. × 1000 h treatment (MPa) | 52 | 30 | 60 | 68 |
| Adhesiveness | Initial adhesive force (N/cm) | 20 | 22 | 16 | 16 |
|  | Long-term adhesion durability-1 (h) | 1300 | 2000 | 1500 | 1200 |
|  | Thermal cyclability | 1300 | 1600 | 1200 | 1000 |
|  | Thermal cyclability after long-term adhesion durability test | 300 | 500 | 300 | 250 |
| Insulation reliability | Breakdown voltage (kV/mm) | 103 | 70 | 102 | 100 |
|  | Amount of migration (µm) | 5 | 10 | 5 | 5 |

|  |  | Example 12 | Example 13 | Example 14 | Example 15 |
|---|---|---|---|---|---|
| Thermoplastic resin (a) | Upper line: kind | B-6 | B-6 | B-6 | B-6 |
|  | Lower line: content (parts by weight) | 100 | 100 | 100 | 100 |
| Epoxy resin (b) | Upper line: kind | EOCN102S | EOCN102S | EOCN102S | EOCN102S |
|  | Lower line: content (parts by weight) | 37 | 37 | 37 | 37 |
| Hardener (c) | Upper line: kind | CKM2400 | CKM2400 | CKM2400 | CKM1282 |
|  | Lower line: content (parts by weight) | 50 | 50 | 50 | 50 |
| Organopolysiloxane (d) | Upper line: kind | A-7 | A-8 | A-9 | A-7 |
|  | Lower line: content (parts by weight) | 100 | 100 | 100 | 100 |
| Curing catalyst | Upper line: kind | 2EZ | 2EZ | 2EZ | 2EZ |
|  | Lower line: content (parts by weight) | 0.3 | 0.3 | 0.3 | 0.3 |
| Glass transition temperature (Tg) | Initial (° C.) | 16 | 24 | −5 | 24 |
|  | After 175° C. × 1000 h treatment (° C.) | 52 | 63 | 35 | 60 |
|  | Rate of change (%) | 12.5 | 13.1 | 14.9 | 12.1 |
| Storage elastic modulus | Initial (MPa) | 34 | 23 | 0.05 | 41 |
|  | After 175° C. × 1000 h treatment (MPa) | 85 | 72 | 96 | 119 |
| Adhesiveness | Initial adhesive force (N/cm) | 15 | 23 | 24 | 14.5 |
|  | Long-term adhesion durability-1 (h) | 1400 | 1400 | 1200 | 1400 |
|  | Thermal cyclability | 900 | 1000 | 1700 | 800 |
|  | Thermal cyclability after long-term adhesion durability test | 250 | 300 | 350 | 250 |
| Insulation reliability | Breakdown voltage (kV/mm) | 108 | 115 | 58 | 138 |
|  | Amount of migration (µm) | <5 | <5 | 20 | <2 |

EOCN102S: Cresol novolac type epoxy resin produced by Nippon Kayaku Co., Ltd.
CKM2400: p-tert-Bu type/bisphenol A novolac resin produced by Showa Highpolymer Co., Ltd.
CKM1282: Co-condensate of p-tert-Bu type/phenol resol resin produced by Showa Highpolymer Co., Ltd.
2EZ: 2-Ethylimidazole

TABLE 5

|  |  | Example 16 | Example 17 | Example 18 | Example 19 |
|---|---|---|---|---|---|
| Thermoplastic resin (a) | Upper line: kind | B-6 | B-6 | B-6 | B-6 |
|  | Lower line: content (parts by weight) | 100 | 100 | 100 | 100 |
| Epoxy resin (b) | Upper line: kind | EOCN102S | EOCN102S | EOCN102S | EOCN102S |
|  | Lower line: content (parts by weight) | 37 | 37 | 37 | 37 |
| Hardener (c) | Upper line: kind | CKM1636 | CKM1636 | CKM1636 | CKM1636 |
|  | Lower line: content (parts by weight) | 50 | 50 | 50 | 50 |
| Organopolysiloxane (d) | Upper line: kind | A-7 | A-7 | A-7 | A-3 |
|  | Lower line: content (parts by weight) | 100 | 100 | 100 | 40 |
| Curing catalyst | Upper line: kind | 2EZ | 2EZ | 2EZ | 2EZ |
|  | Lower line: content (parts by weight) | 0.3 | 0.3 | 0.3 | 0.3 |
| Other additive | Upper line: kind | — | BTZ | HOBP | — |
|  | Lower line: content (parts by weight) |  | 0.5 | 0.5 |  |

TABLE 5-continued

|  |  |  |  |  |  |
|---|---|---|---|---|---|
| Glass transition temperature (Tg) | Initial (° C.) | 19 | 19 | 19 | 28 |
|  | After 175° C. × 1000 h treatment (° C.) | 54 | 50 | 52 | 65 |
|  | Rate of change (%) | 12.0 | 10.6 | 11.3 | 12.3 |
| Storage elastic modulus | Initial (MPa) | 41 | 40 | 40 | 15 |
|  | After 175° C. × 1000 h treatment (MPa) | 119 | 105 | 105 | 62 |
| Adhesiveness | Initial adhesive force (N/cm) | 14.5 | 14.8 | 14.7 | 21 |
|  | Long-term adhesion durability-1 (h) | 1400 | 1600 | 1500 | 1500 |
|  | Thermal cyclability | 800 | 800 | 800 | 1000 |
|  | Thermal cyclability after long-term adhesion durability test | 250 | 250 | 250 | 300 |
| Insulation reliability | Breakdown voltage (kV/mm) | 138 | 133 | 133 | 102 |
|  | Amount of migration (μm) | <5 | <5 | <5 | <5 |

|  |  | Example | | | |
|---|---|---|---|---|---|
|  |  | 20 | 21 | 22 | 23 |
| Thermoplastic resin (a) | Upper line: kind | B-6 | B-7 | B-8 | B-9 |
|  | Lower line: content (parts by weight) | 100 | 100 | 100 | 100 |
| Epoxy resin (b) | Upper line: kind | EOCN102S | EOCN102S | EOCN102S | EOCN102S |
|  | Lower line: content (parts by weight) | 37 | 37 | 37 | 37 |
| Hardener (c) | Upper line: kind | CKM1636 | CKM1636 | CKM1636 | CKM1636 |
|  | Lower line: content (parts by weight) | 50 | 50 | 50 | 50 |
| Organopolysiloxane (d) | Upper line: kind | A-3 | A-3 | A-3 | A-3 |
|  | Lower line: content (parts by weight) | 20 | 40 | 40 | 20 |
| Curing catalyst | Upper line: kind | 2EZ | 2EZ | 2EZ | 2EZ |
|  | Lower line: content (parts by weight) | 0.3 | 0.3 | 0.3 | 0.3 |
| Other additive | Upper line: kind | — | — | — | — |
|  | Lower line: content (parts by weight) |  |  |  |  |
| Glass transition temperature (Tg) | Initial (° C.) | 34 | 5 | 14 | 18 |
|  | After 175° C. × 1000 h treatment (° C.) | 80 | 36 | 48 | 54 |
|  | Rate of change (%) | 15.0 | 11.2 | 11.8 | 12.4 |
| Storage elastic modulus | Initial (MPa) | 21 | 0.6 | 6 | 12 |
|  | After 175° C. × 1000 h treatment (MPa) | 76 | 42 | 54 | 66 |
| Adhesiveness | Initial adhesive force (N/cm) | 23 | 14 | 17 | 18 |
|  | Long-term adhesion durability-1 (h) | 1100 | 1500 | 1400 | 1300 |
|  | Thermal cyclability | 900 | 1500 | 1300 | 1200 |
|  | Thermal cyclability after long-term adhesion durability test | 250 | 350 | 300 | 300 |
| Insulation reliability | Breakdown voltage (kV/mm) | 110 | 58 | 102 | 114 |
|  | Amount of migration (μm) | 5 | 10 | 5 | <5 |

EOCN102S: Cresol novolac type epoxy resin produced by Nippon Kayaku Co., Ltd.
CKM1636: p-tert-Bu type novolac resin produced by Showa Highpolymer Co., Ltd.
2EZ: 2-Ethylimidazole
BTZ: 1,2,3-Benzotriazole
HOBP: 2-Hydroxy-4-n-octoxybenzophenone

TABLE 6

|  |  | Example | | Comparative example | |
|---|---|---|---|---|---|
|  |  | 24 | 25 | 1 | 2 |
| Thermoplastic resin (a) | Upper line: kind | B-10 | B-6 | — | B-2 |
|  | Lower line: content (parts by weight) | 100 | 100 |  | 100 |
| Epoxy resin (b) | Upper line: kind | EOCN102S | EOCN102S | EOCN102S | EOCN102S |
|  | Lower line: content (parts by weight) | 37 | 37 | 37 | 37 |
| Hardener (c) | Upper line: kind | CKM1636 | CKM2400 | CKM1636 | CKM1636 |
|  | Lower line: content (parts by weight) | 50 | 50 | 50 | 50 |
| Organopolysiloxane (d) | Upper line: kind | A-3 | A-3 | A-7 | — |
|  | Lower line: content (parts by weight) | 20 | 200 | 100 |  |
| Curing catalyst | Upper line: kind | 2EZ | 2EZ | 2EZ | 2EZ |
|  | Lower line: content (parts by weight) | 0.3 | 0.3 | 0.3 | 0.3 |
| Glass transition temperature (Tg) | Initial (° C.) | 46 | 10 | −15 | 54 |
|  | After 175° C. × 1000 h treatment (° C.) | 93 | 34 | 0 | 148 |
|  | Rate of change (%) | 14.7 | 8.5 | 5.8 | 28.7 |
| Storage elastic modulus | Initial (MPa) | 65 | 2 | 0.005 | 83 |
|  | After 175° C. × 1000 h treatment (MPa) | 181 | 32 | 0.01 | 780 |
| Adhesiveness | Initial adhesive force (N/cm) | 19 | 13 | 11 | 25 |
|  | Long-term adhesion durability-1 (h) | 1000 | 2000 | 2000 | 100 |
|  | Thermal cyclability | 300 | 1500 | 1600 | 50 |
|  | Thermal cyclability after long-term adhesion durability test | h | 450 | 500 | — |
| Insulation reliability | Breakdown voltage (kV/mm) | 142 | 95 | 31 | 158 |
|  | Amount of migration (μm) | <5 | <5 | 20< | 5 |

TABLE 6-continued

|  |  | Comparative example | | | |
|---|---|---|---|---|---|
|  |  | 3 | 4 | 5 | 6 |
| Thermoplastic resin (a) | Upper line: kind | B-2 | B-7 | B-6 | — |
|  | Lower line: content (parts by weight) | 100 | 100 | 100 |  |
| Epoxy resin (b) | Upper line: kind | — | EOCN102S | EOCN102S | — |
|  | Lower line: content (parts by weight) |  | 37 | 37 |  |
| Hardener (c) | Upper line: kind | CKM1636 | — | CKM2400 | — |
|  | Lower line: content (parts by weight) | 50 |  | 50 |  |
| Organopolysiloxane (d) | Upper line: kind | — | — | A-3 | A-10/A-11 |
|  | Lower line: content (parts by weight) |  |  | 0.1 |  |
| Curing catalyst | Upper line: kind | 2EZ = | 2EZ | 2EZ | Pt-based |
|  | Lower line: content (parts by weight) | 0.3 | 0.3 | 0.3 |  |
| Glass transition temperature (Tg) | Initial (° C.) | 50 | 45 | 12 | −5 |
|  | After 175° C. × 1000 h treatment (° C.) | 122 | 106 | 77 | −1 |
|  | Rate of change (%) | 22.3 | 19.2 | 22.8 | 1.5 |
| Storage elastic modulus | Initial (MPa) | 78 | 71 | 5 | 0.5 |
|  | After 175° C. × 1000 h treatment (MPa) | 660 | 570 | 92 | 1.2 |
| Adhesiveness | Initial adhesive force (N/cm) | 18 | 23 | 19 | 5 |
|  | Long-term adhesion durability-1 (h) | 50 | 150 | 100 | 2000 |
|  | Thermal cyclability | 100 | 150 | 1500 | 1600 |
|  | Thermal cyclability after long-term adhesion durability test | — | — | — | 500 |
| Insulation reliability | Breakdown voltage (kV/mm) | 145 | 132 | 97 | 28 |
|  | Amount of migration (μm) | 10 | 20 | 20 | <5 |

EOCN102S: Cresol novolac type epoxy resin produced by Nippon Kayaku Co., Ltd.
CKM2400: p-tert-Bu type novolac resin produced by Showa Highpolymer Co., Ltd.
CKM1636: p-tert-Bu type novolac resin produced by Showa Highpolymer Co., Ltd.
2EZ: 2-Ethylimidazole Examples 26 to 32

Adhesive sheets were produced and evaluated in the same manner as in Example 1 except for preparing adhesive solutions so that the resin composition ratios provided in Table 7 might be produced. Evaluation results are provided in Table 7.

TABLE 7

|  |  |  |  | Example 26 | Example 27 | Example 28 | Example 29 |
|---|---|---|---|---|---|---|---|
| Composition of adhesive | Thermoplastic resin (a) | Upper line: kind | | B-2 | B-2 | B-1 | B-1 |
|  |  | Lower line: content (parts by weight) | | 100 | 100 | 100 | 100 |
|  | Epoxy resin (b) | Upper line: kind | | EOCN-102S | EOCN-102S | EOCN-102S | EOCN-102S |
|  |  | Lower line: content (parts by weight) | | 100 | 91.3 | 104 | 63.6 |
|  | Hardener (c) | Upper line: kind | | H-4 | H-4 | PS2780 | PS2780 |
|  |  | Lower line: content (parts by weight) | | 50 | 45.6 | 50 | 31.8 |
|  | Organopolysiloxane (d) | Upper line: kind | | A-3 | A-3 | A-3 | A-3 |
|  |  | Lower line: content (parts by weight) | | 130 | 130 | 130 | 100 |
|  | Curing catalyst | Upper line: kind | | TPP | TPP | TPP | TPP |
|  |  | Lower line: content (parts by weight) | | 2.2 | 2.2 | 2.2 | 1.5 |
|  | Heterocyclic azole (e) | Upper line: kind | | 5-Methyl-benzotriazole | 5-Methyl-benzotriazole | 5-Carboxyl benzotriazole | Thiazole |
|  |  | Lower line: content (parts by weight) | | 8.6 | 21.7 | 4.3 | 6.1 |
|  | Inorganic filler (f) | Upper line: kind | | SO-C1 | SO-C1 | SO-C1 | — |
|  |  | Lower line: content (parts by weight) | | 43.4 | 43.4 | 43.4 |  |
| Evaluation result | Glass transition temperature (Tg) | Initial (° C.) | | 35 | 36 | 33 | 10 |
|  |  | After 175° C. × 1000 h treatment (° C.) | | 78 | 80 | 76 | 39 |
|  |  | Rate of change (%) | | 14 | 14.2 | 14.1 | 10.2 |
|  | Storage elastic modulus | Initial (MPa) | | 45 | 52 | 48 | 7 |
|  |  | After 175° C. × 1000 h treatment (MPa) | | 74 | 76 | 82 | 39 |
|  | Initial adhesive force (N/cm) | | | 13 | 13 | 13 | 15 |
|  | Initial shear strength (MPa) | | | 15 | 13 | 13 | 16 |
|  | Long-term adhesion durability-1 (h) | | | 1200 | 1100 | 1200 | 1600 |
|  | Thermal cyclability after long-term adhesion durability test | | | 250 | 200 | 450 | 400 |
|  | Insulation reliability (migration) | | | 6 | 12 | 8 | 5 |

|  |  |  | Example 30 | Example 31 | Example 32 |
|---|---|---|---|---|---|
| Composition of adhesive | Thermoplastic resin (a) | Upper line: kind | B-1 | B-1 | B-2 |
|  |  | Lower line: content (parts by weight) | 100 | 100 | 100 |
|  | Epoxy resin (b) | Upper line: kind | EOCN-102S | EOCN-102S | EOCN-102S |
|  |  | Lower line: content (parts by weight) | 63.6 | 63.6 | 100 |

TABLE 7-continued

| | | | | | |
|---|---|---|---|---|---|
| | Hardener (c) | Upper line: kind | PS2780l | PS2780l | CKM1282 |
| | | Lower line: content (parts by weight) | 31.8 | 31.8 | 50 |
| | Organopolysiloxane (d) | Upper line: kind | A-3 | A-3 | A-3 |
| | | Lower line: content (parts by weight) | 100 | 100 | 130 |
| | Curing catalyst | Upper line: kind | TPP | TPP | TPP |
| | | Lower line: content (parts by weight) | 1.5 | 1.5 | 2.2 |
| | Heterocyclic azole (e) | Upper line: kind | Tetrazole | 5-Methyl-benzotriazole | 5-Methyl-benzotriazole |
| | | Lower line: content (parts by weight) | 6.1 | 6.1 | 8.6 |
| | Inorganic filler (f) | Upper line: kind | — | — | SO-C1 |
| | | Lower line: content (parts by weight) | | | 43.4 |
| Evaluation result | Glass transition temperature (Tg) | Initial (° C.) | 10 | 10 | 40 |
| | | After 175° C. × 1000 h treatment (° C.) | 41 | 37 | 84 |
| | | Rate of change (%) | 11 | 9.5 | 14 |
| | Storage elastic modulus | Initial (MPa) | 7 | 7 | 52 |
| | | After 175° C. × 1000 h treatment (MPa) | 42 | 36 | 74 |
| | Initial adhesive force (N/cm) | | 16 | 15 | 13 |
| | Initial shear strength (MPa) | | 16 | 15 | 15 |
| | Long-term adhesion durability-1 (h) | | 1500 | 1700 | 1200 |
| | Thermal cyclability after long-term adhesion durability test | | 400 | 450 | 250 |
| | Insulation reliability (migration) | | 5 | 5 | <2 |

SO-C1 (surface treated): Spherical silica, produced by Admatechs Co., Ltd., having an average particle diameter of 0.3 μm
H-4: Novolac type phenol resin, produced by Meiwa Plastic Industries, Ltd.
PS2780: Co-condensate of p-tert-Bu type resol resin/bisphenol A resol resin, produced by Gunei Chemical Industry Co., Ltd.
CKM1282: Co-condensate of p-tert-Bu type resol resin/phenol resol resin, produced by Showa Highpolymer Co., Ltd.
TPP: Triphenylphosphine

Example 33

The inorganic filler, the epoxy resin, and the curing catalyst given in Table 8 were added to toluene so that the solid content would become 50% by weight, followed by stirring at 80° C. for 3 hours. Moreover, the thermoplastic resin given in Table 8 was added and methyl ethyl ketone was added so that the solid content might become 20% by weight, followed by stirring at 80° C. for 5 hours. Furthermore, a hardener, an organopolysiloxane, and a mixed solvent of methyl ethyl ketone/toluene=2/1 (weight ratio) were added, followed by stirring and mixing at 30° C. Then, preparation of an adhesive sheet and evaluation thereof were carried out in the same manner as in Example 1. A presumed phase structure was depicted in FIG. 5 and evaluation results were provided in Table 8. An island A21 containing an epoxy resin as a primary component and an island B23 containing a thermoplastic resin as a primary component were present in a sea C22 containing an organopolysiloxane and the island A21 and the island B23 were in contact with each other. Moreover, an inorganic filler 24 was present in the island A21.

Example 34

Figure 6:
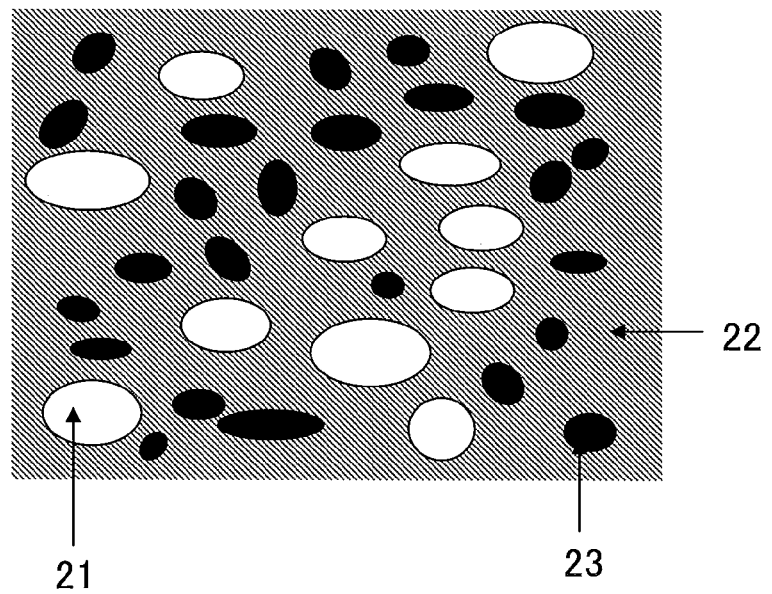
FIG. 6 is a phase separation structure of Example 34.

An adhesive sheet was produced by preparing an adhesive solution in the same manner as in Example 1 except for using a thermoplastic resin, an epoxy resin, a hardener, an organopolysiloxane, and a curing catalyst so that the resin composition ratio may become that provided in Table 8. A presumed phase structure was depicted in FIG. 6 and evaluation results are provided in Table 8. An island A21 containing an epoxy resin as a primary component and an island B23 containing a thermoplastic resin as a primary component were dispersed in a sea C22 containing an organopolysiloxane.

Example 35

Figure 7:
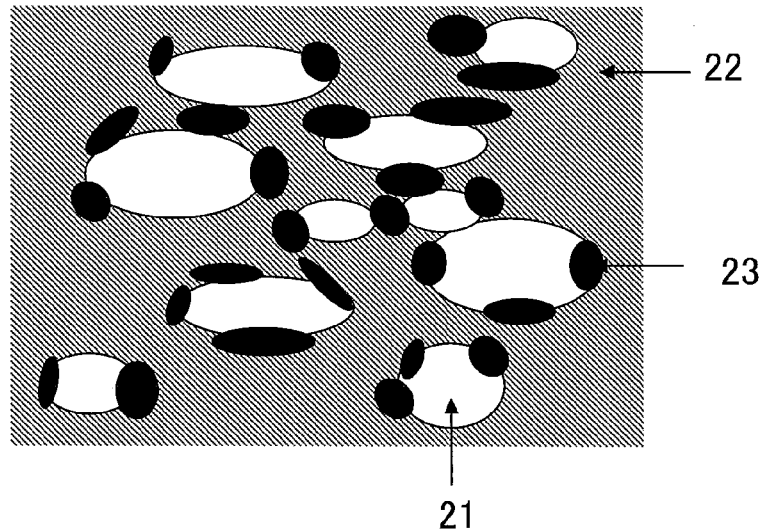
FIG. 7 is a phase separation structure of Example 35.

The epoxy resin, the thermoplastic resin, and the curing catalyst provided in Table 8 were added to a mixed solvent of methyl ethyl ketone/toluene=2/1 (weight ratio) so that a solid content will become 20% by weight, and they were stirred at 80° C. for 8 hours. Subsequently, the hardener and the organopolysiloxane provided in Table 8 and a mixed solvent of methyl ethyl ketone/toluene=2/1 (weight ratio) were added to adjust the solid content to 20% by weight. Henceforth, an adhesive sheet was produced in the same manner as in Example 33. A presumed phase structure was depicted in FIG. 7 and evaluation results are provided in Table 8. An island A21 containing an epoxy resin as a primary component and an island B23 containing a thermoplastic resin as a primary component are present in a sea C22 containing an organopolysiloxane and the island A21 and the island B23 are in contact with each other.

Example 36

Figure 8:
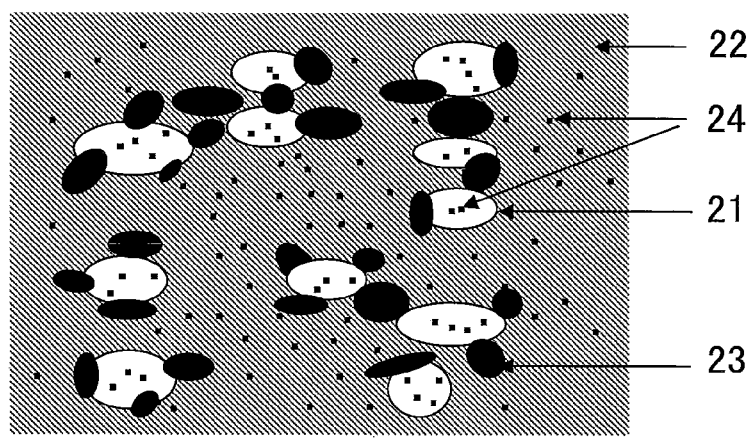
FIG. 8 is a phase separation structure of Example 36.

The epoxy resin and the curing catalyst provided in Table 8 were added to toluene so that the solid content may become 50% by weight, and were stirred at 80° C. for 3 hours. Moreover, the thermoplastic resin given in Table 8 was added. Then methyl ethyl ketone was added so that the solid content may become 20% by weight, followed by stirring at 80° C. for 5 hours. An adhesive sheet was produced in the same manner as in Example 33 except for adding a hardener, an organopolysiloxane, an inorganic filler, and a mixed solvent of methyl ethyl ketone/toluene=2/1 (weight ratio), stirring and mixing at 30° C. A presumed phase structure is depicted in FIG. 8 and evaluation results are provided in Table 8. An island A21 containing an epoxy resin as a primary component, an island B23 containing a thermoplastic resin as a primary component, and an inorganic filler 24 were dispersed in a sea C22 containing an organopolysiloxane.

TABLE 8

|  |  |  | Example 33 | Example 34 | Example 35 | Example 36 |
|---|---|---|---|---|---|---|
| Composition of adhesive | Thermoplastic resin (a) | Upper line: kind | B-1 | B-1 | B-1 | B-1 |
|  |  | Lower line: content (parts by weight) | 100 | 100 | 100 | 100 |
|  | Epoxy resin (b) | Upper line: kind | E1031S | E1031S | E1031S | E1031S |
|  |  | Lower line: content (parts by weight) | 120 | 120 | 120 | 120 |
|  | Hardener (c) | Upper line: kind | CKM908 | CKM908 | CKM908 | CKM908 |
|  |  | Lower line: content (parts by weight) | 56 | 56 | 56 | 56 |
|  | Organopolysiloxane (d) | Upper line: kind | A4 | A4 | A4 | A4 |
|  |  | Lower line: content (parts by weight) | 80 | 80 | 80 | 80 |
|  | Curing catalyst (e) | Upper line: kind | C11Z | C11Z | C11Z | C11Z |
|  |  | Lower line: content (parts by weight) | 4 | 4 | 4 | 4 |
|  | Inorganic filler (g) | Upper line: kind | SO-C1 (surface-treated article) | — | — | SO-C1 (surface-treated article) |
|  |  | Lower line: content (parts by weight) | 40 |  |  | 40 |
| Phase separation structure |  |  | (FIG. 5) | (FIG. 6) | (FIG. 7) | (FIG. 8) |
| Glass transition temperature (Tg) | Initial (° C.) |  | 42 | 41 | 39 | 45 |
|  | After 175° C. × 1000 h treatment (° C.) |  | 88 | 86 | 84 | 92 |
|  | Rate of change (%) |  | 14.7 | 14.4 | 14.4 | 14.8 |
| Storage elastic modulus | Initial (MPa) |  | 72 | 63 | 39 | 96 |
|  | After 175° C. × 1000 h treatment (MPa) |  | 210 | 130 | 90 | 320 |
| Reflow resistance (Number of peeled samples/20 samples) |  |  | 0/20 | 4/20 | 2/20 | 0/20 |
| Insulation reliability | Insulation resistance value just after measurement (Ω) |  | $2 \times 10^{10}$ | $8 \times 10^{9}$ | $1 \times 10^{10}$ | $4 \times 10^{10}$ |
|  | Insulation resistance value after 400 hours (Ω) |  | $9 \times 10^{10}$ | $4 \times 10^{9}$ | $6 \times 10^{9}$ | $2 \times 10^{10}$ |
| Adhesiveness | Initial adhesive force (N/cm) |  | 11 | 12 | 13 | 10 |
|  | Long-term adhesion durability-1 (h) |  | 450 | 1100 | 1200 | 350 |
|  | Long-term adhesion durability-2 (h) |  | 600 | — | — | — |
|  | Thermal cyclability |  | 800 | 800 | 900 | 500 |

E1031S: Tetraphenylolethane-type epoxy resin, produced by Japan Epoxy Resins Co., Ltd.
CKM908: Bisphenol A type resol resin, produced by Showa Highpolymer Co., Ltd.
C11Z: 2-Undecylimidazole

INDUSTRIAL APPLICABILITY

Since the adhesive composition for electronic components of the present invention maintains excellent adhesiveness also under high temperature conditions over a long period of time and is excellent in thermal cyclability and insulation reliability, the reliability of an electronic component using it can increase. The adhesive composition for electronic components and the adhesive sheet for electronic components of the present invention are used suitably for various types of electronic materials, such as (1) a substrate for semiconductor connection to be used in mounting a semiconductor element or a semiconductor integrated circuit for a wiring board (i.e., interposer), such as a TAB-type pattern processing tape and an interposer for a BGA package, (2) a lead frame fixing tape and a LOC fixing tape, (3) a die bonding material for bonding an electronic component, such as a semiconductor element, and a supporting member, such as a lead frame and an insulating supporting substrate, (4) adhesives, such as a heat spreader, a stiffener, and a shield material, (5) a sealing material of an electronic device, (6) adhesives for optical applications, such as an adhesive for light path binding, an adhesive for assembling an optical component, and a sealant for LED, and (7) a solder resist, an anisotropic conductive film, a copper-lined laminated sheet, a cover lay, and an insulating layer between circuits.

The invention claimed is:

1. An adhesive composition for electronic components comprising (a) a thermoplastic resin, (b) an epoxy resin, (c) a hardener, and (d) an organopolysiloxane, wherein the glass transition temperature (Tg) after curing is −10° C. to 50° C. and the rate of change of Tg after heat-treating the composition at 175° C. for 1000 hours is 15% or less and the organopolysiloxane (d) contains bifunctional siloxane units and tri- or higher functional siloxane units.

2. The adhesive composition for electronic components according to claim 1, wherein both the storage elastic modulus at 30° C. after curing and the storage elastic modulus at 30° C. after further heating at 175° C. for 1000 hours are 0.1 MPa to 100 MPa.

3. The adhesive composition for electronic components according to claim 1 or 2, wherein the organopolysiloxane (d) contains at least one functional group selected from the group consisting of a hydroxyl group, an epoxy group, an alkoxyl group, a vinyl group, a silanol group, a carboxyl group, an amino group, an oxetanyl group, and a hydrosilyl group.

4. The adhesive composition for electronic components according to claim 3, wherein the content of the functional group of the organopolysiloxane (d) is 0.3 to 30% by weight in the organopolysiloxane (d).

5. The adhesive composition for electronic components according to claim 1, wherein the organopolysiloxane (d) has alkyl groups and phenyl groups attached to silicon atoms and the content of the phenyl groups is 5 to 70 mol % based on the total molar number of the alkyl groups and the phenyl groups attached to silicon atoms.

6. The adhesive composition for electronic components according to claim 1, wherein the bifunctional siloxane units in the organopolysiloxane (d) are present in an amount of 20 to 90 mol %.

7. The adhesive composition for electronic components according to claim 1, wherein the thermoplastic resin (a) has at least one functional group selected from the group consisting of an epoxy group, a hydroxyl group, a carboxyl group, an amino group, a vinyl group, a silanol group, and an isocyanate group in an amount of 0.9 to 3.0 eq/kg and contains an acrylic acid ester or methacrylic acid ester with a side chain having 1 to 8 carbon atoms.

8. The adhesive composition for electronic components according to claim 1 further comprising (e) a heterocyclic azole compound.

9. The adhesive composition for electronic components according to claim 8, wherein the heterocyclic azole compound (e) is a benzotriazole compound.

10. The adhesive composition for electronic components according to claim 1, wherein when the composition is cured to a curing reaction ratio, as measured by differential scanning calorimetry measurement, of 70% to 100%, the composition has a sea-island structure containing an island A containing the epoxy resin (b) as a primary component, an island B containing the thermoplastic resin (a) as a primary component, and a sea C containing the organopolysiloxane (d) as a primary component, and the island A and the island B are in contact with each other.

11. The adhesive composition for electronic components according to claim 10, wherein two or more islands B are in contact with one island A in the sea-island structure.

12. The adhesive composition for electronic components according to claim 10 or 11 further comprising (f) an inorganic filler, wherein the inorganic filler (f) is localized in the island A in the sea island structure.

13. An adhesive sheet for electronic components comprising an adhesive layer formed from the adhesive composition for electronic components according to claim 1, and at least one peelable protective film layer.

14. An electronic component comprising an adhesive layer formed from the adhesive composition for electronic components according to claim 1.

15. The electronic component according to claim 14, wherein the component has, on a substrate, a first conductive layer, a semiconductor integrated circuit, an adhesive layer formed from the adhesive composition for electronic components according to claim 1 being in contact with at least a part of the first conductive layer and at least a part of the semiconductor integrated circuit, and a second conductive layer that connects the first conductive layer and the semiconductor integrated circuit.

* * * * *